United States Patent
Huang et al.

(10) Patent No.: US 11,373,912 B2
(45) Date of Patent: Jun. 28, 2022

(54) SEMICONDUCTOR STRUCTURE AND METHOD FOR FORMING THE SAME

(71) Applicants: Semiconductor Manufacturing International (Shanghai) Corporation, Shanghai (CN); Semiconductor Manufacturing International (Beijing) Corporation, Beijing (CN)

(72) Inventors: Hao Jun Huang, Shanghai (CN); Yong Gen He, Shanghai (CN)

(73) Assignees: Semiconductor Manufacturing International (Shanghai) Corporation, Shanghai (CN); Semiconductor Manufacturing International (Beijing) Corporation, Beijing (CN)

(*) Notice: Subject to any disclaimer, the term of this patent is extended or adjusted under 35 U.S.C. 154(b) by 0 days.

(21) Appl. No.: 16/932,340

(22) Filed: Jul. 17, 2020

(65) Prior Publication Data

US 2021/0020425 A1    Jan. 21, 2021

(30) Foreign Application Priority Data

Jul. 18, 2019   (CN) .......................... 201910649261.9

(51) Int. Cl.
*H01L 21/8234* (2006.01)
*H01L 21/28* (2006.01)
(Continued)

(52) U.S. Cl.
CPC .. *H01L 21/82345* (2013.01); *H01L 21/02019* (2013.01); *H01L 21/28088* (2013.01);
(Continued)

(58) Field of Classification Search
CPC ..... H01L 21/823431; H01L 21/823821; H01L 21/28079–28088; H01L 21/32051;
(Continued)

(56) References Cited

U.S. PATENT DOCUMENTS

2012/0083111 A1* 4/2012 Lim .................. H01L 21/32139
                                                    438/591
2012/0248550 A1* 10/2012 Huang ................. H01L 27/088
                                                    257/E21.328
(Continued)

FOREIGN PATENT DOCUMENTS

CN         105719960 A  *  6/2016    ......... H01L 21/0206
CN         105826256 A  *  8/2016
(Continued)

*Primary Examiner* — Errol V Fernandes
*Assistant Examiner* — Jeremy J Joy
(74) *Attorney, Agent, or Firm* — Anova Law Group, PLLC

(57) ABSTRACT

A method for forming a semiconductor structure includes forming a dielectric layer on a substrate, including a first region and a second region; forming a first gate opening and a second gate opening in dielectric layer of the first region and the second region, respectively; forming initial work function layers on bottom and sidewall surfaces of the first gate opening and the second gate opening; and performing at least one cycle of a combined etching process to etch the initial work function layers formed in the first gate opening and form a work function layer in the second gate opening from the initial work function layers. Each cycle of the combined etching process includes performing an oxide etching process to etch the initial work function layers; and then performing a main etching process on the initial work function layers to remove an exposed initial work function layer.

20 Claims, 13 Drawing Sheets

(51) Int. Cl.
*H01L 21/3205* (2006.01)
*H01L 21/3213* (2006.01)
*H01L 29/49* (2006.01)
*H01L 29/66* (2006.01)
*H01L 21/02* (2006.01)
*H01L 29/78* (2006.01)

(52) U.S. Cl.
CPC .. *H01L 21/32051* (2013.01); *H01L 21/32134* (2013.01); *H01L 21/823431* (2013.01); *H01L 21/823468* (2013.01); *H01L 29/4966* (2013.01); *H01L 29/66795* (2013.01); *H01L 29/66803* (2013.01); *H01L 29/7851* (2013.01)

(58) Field of Classification Search
CPC ....... H01L 21/82345; H01L 21/823842; H01L 21/32133–32134; H01L 21/32138; H01L 27/0886; H01L 27/1211; H01L 29/66795; H01L 29/785–7851; H01L 29/4966; H01L 29/495–4958
See application file for complete search history.

(56) References Cited

U.S. PATENT DOCUMENTS

| | | | | |
|---|---|---|---|---|
| 2013/0075827 | A1* | 3/2013 | Lee | H01L 29/66545 438/301 |
| 2014/0363981 | A1* | 12/2014 | Nowling | H01L 21/32134 438/754 |
| 2016/0181163 | A1* | 6/2016 | Huang | H01L 27/0924 257/369 |
| 2017/0263730 | A1* | 9/2017 | Yu | H01L 21/31111 |
| 2018/0090313 | A1* | 3/2018 | Chung | H01L 21/0217 |
| 2020/0044073 | A1* | 2/2020 | Huang | H01L 29/785 |

FOREIGN PATENT DOCUMENTS

| | | | | | |
|---|---|---|---|---|---|
| CN | 105990341 | A | * | 10/2016 | |
| CN | 108258028 | A | * | 7/2018 | ......... H01L 29/0688 |
| CN | 110459468 | A | * | 11/2019 | |
| JP | 2004140315 | A | * | 5/2004 | ........... C23C 14/021 |

* cited by examiner

SEMICONDUCTOR STRUCTURE AND METHOD FOR FORMING THE SAME

CROSS-REFERENCE TO RELATED APPLICATION

This application claims priority to Chinese Patent Application No. 201910649261.9, filed on Jul. 18, 2019, the entire content of which is incorporated herein by reference.

TECHNICAL FIELD

The present disclosure generally relates to the field of semiconductor manufacturing and, more particularly, relates to semiconductor structures and fabrication methods thereof.

BACKGROUND

In the field of integrated circuit (IC) manufacturing, as the size of transistors continues to shrink, the physical limits of devices have an increasing impact on device preparation, and the feature size of devices has also become more difficult to be scaled down. Specifically, the difficulty of manufacturing transistors and their circuits has also increased significantly.

In addition, it is also desirable to form transistors with different functions over a same substrate. In the existing technology, a work function layer is used to adjust the performance of a transistor formed by a post-metal gate process to meet the needs of transistors with different functions.

However, the performance of the existing transistor may still need to be improved. The disclosed semiconductor structures and fabrication methods thereof are directed to solve one or more problems set forth above and other problems in the art.

SUMMARY

To address the problems described above, embodiments and implementations of the present disclosure provide a semiconductor structure and a method for forming the same.

One aspect of the present disclosure provides a method for forming a semiconductor structure. The method includes providing a substrate structure, including a substrate, including a first region and a second region, and a dielectric layer disposed on the substrate. The dielectric layer in the first region includes a first gate opening, and the dielectric layer in the second region includes a second gate opening. The method also includes forming a plurality of initial work function layers on bottom and sidewall surfaces of the first gate opening and bottom and sidewall surfaces of the second gate opening; and performing at least one cycle of a combined etching process to etch the plurality of initial work function layers formed in the first gate opening and form a work function layer in the second gate opening from the plurality of initial work function layers. Each cycle of the combined etching process includes performing an oxide etching process to etch the plurality of initial work function layers; and after the oxide etching process, performing a main etching process on the plurality of initial work function layers to remove an exposed initial work function layer of the plurality of initial work function layers.

Optionally, the initial work function layer is made of a material including titanium nitride ($TiN_x$), titanium aluminide (TiAl), tantalum nitride ($TaN_x$), or a combination thereof.

Optionally, the oxide etching process includes a first wet etching process.

Optionally, an etching solution used in the first wet etching process includes a hydrogen fluoride (HF) solution, and a volume ratio of hydrogen fluoride to water in the HF solution is 1:200.

Optionally, the main etching process includes a second wet etching process.

Optionally, an etching solution used in the second wet etching process includes one of a hydrogen peroxide ($H_2O_2$) solution, a mixed solution of ammonia water ($NH_4OH$) and hydrogen peroxide, and a mixed solution of hydrogen chloride (HCl) and hydrogen peroxide; and a temperature of the etching solution is in a range of approximately 50° C. to 80° C.

Optionally, each cycle of the combined etching processes further includes prior to performing the oxide etching process, performing a first surface treatment process on the plurality of initial work function layers formed in the first gate opening.

Optionally, the first surface treatment process includes a hydrophilic treatment process, and a solution used in the hydrophilic treatment process includes an isopropanol solution.

Optionally, each cycle of the combined etching processes further includes prior to performing the main etching process, and after performing the oxide etching process, performing a second surface treatment process on the plurality of initial work function layers formed in the first gate opening.

Optionally, the second surface treatment process includes a hydrophilic treatment process; and a solution used in the hydrophilic treatment process includes an isopropanol solution.

Optionally, after performing the main etching process to etch the plurality of initial work function layers, each cycle of the combined etching processes further includes using deionized (DI) water to rinse the first gate opening.

Optionally, when the plurality of initial work function layers includes more than one initial work function layer, a number of cycling times of the combined etching process is smaller than or equal to a number of layers that form the plurality of initial work function layers.

Optionally, after the work function layer is formed in the second gate opening, the method further includes performing a drying treatment process on the substrate. the drying treatment process includes electric hot-plate heating drying, air heating drying, hydrothermal drying, or chemical reagent dehydration treatment.

Optionally, the drying treatment process includes chemical reagent dehydration treatment; and a solution used in the chemical reagent dehydration treatment includes an isopropanol solution at a temperature in a range of approximately 50° C. to 75° C.

Optionally, prior to forming the plurality of the initial work function layers on the bottom and sidewall surfaces of the first gate opening and the bottom and sidewall surfaces of the second gate opening, the method further includes forming a stop layer on the bottom and sidewall surfaces of the first gate opening and the bottom and sidewall surfaces of the second gate opening.

Optionally, the stop layer is made of a material including tantalum nitride ($TaN_x$), a high-k dielectric material, or the like. A dielectric constant of the high-k dielectric material is larger than 3.9, and the high-k dielectric material includes at least one of hafnium oxide ($HfO_2$), alumina ($Al_2O_3$), and zirconia ($ZrO_2$).

Optionally, the substrate includes a base substrate, a first fin structure disposed on the base substrate of the first region, and a second fin structure disposed on the base substrate of the second region; the dielectric layer is disposed on the first fin structure, the second fin structure, and the substrate; the first gate opening is formed in the dielectric layer and exposes at least a portion of the first fin structure; and the second gate opening is formed in the dielectric layer and exposes at least a portion of the second fin structure.

Optionally, after the work function layer is formed in the second gate opening, the method further includes forming a gate electrode layer in the first gate opening and the second gate opening.

Correspondingly, another aspect of the present disclosure provides a semiconductor structure formed by the disclosed method. The semiconductor structure includes a substrate structure, including: a substrate, including a first region and a second region, and a dielectric layer disposed over the substrate. The dielectric layer in the first region includes a first gate opening, and the dielectric layer in the second region includes a second gate opening. The semiconductor structure also includes a work function layer, formed on bottom and sidewall surfaces of the second gate opening. The bottom and sidewall surfaces of the first gate opening are uncovered by the work function layer.

Optionally, the semiconductor structure further includes a first fin structure formed in the first region and exposed in the first gate opening, a second fin structure formed in the second region and exposed in the second gate opening; a sidewall spacer formed on each of sidewalls of the first gate opening and the second gate opening; and an isolation layer formed on the base substrate and covering a portion of the first fin structure and a portion of the second fin structure. A top surface of the isolation layer is lower than top surfaces of the first fin structure and the second fin structure. The semiconductor structure further includes a first source/drain doped region formed in the first fin structure on each side of the first gate opening; a second source/drain doped region formed in the second fin structure on each side of the second gate opening; and a stop layer formed on the bottom and sidewall surfaces of the first gate opening, and on the bottom and sidewall surfaces of the second gate opening. The first source/drain doped region is separated from the first gate opening by a sidewall spacer; the second source/drain doped region is separated from the second gate opening by a sidewall spacer; and the work function layer is disposed on the stop layer formed on the bottom and sidewall surfaces of the second gate opening. The semiconductor structure further includes a gate electrode layer, formed in the first gate opening and the second gate opening.

Compared to the existing technology, the technical solution of the present disclosure includes the following beneficial effects.

According to the disclosed methods and semiconductor structures, after the plurality of initial work function layers is formed at the bottom and sidewall surfaces of the first gate opening and the second gate opening, the plurality of initial work function layers is etched by an oxide etching process first to remove an oxidized surface portion of the exposed initial work function layer. Then, the plurality of initial work function layers is etched by a main etching process to remove the exposed initial work function layer. The oxide etching process may remove the oxidized surface portion of the initial work function layer, such that the subsequent main etching process may be able to neatly remove the initial work function layer. As such, incomplete removal of the initial work function layer, which may affect the performance of the semiconductor device, can be avoided. Therefore, the performance of the semiconductor structure may be improved.

Further, by performing multiple cycles of a combined etching processes to remove the plurality of initial work function layers, incomplete removal of the initial work function layer, which may affect the performance of the semiconductor device, can be avoided, thereby satisfying the need to form work function layers with various thicknesses on the same substrate. As such, the performance of the semiconductor structure may be improved.

Further, prior to performing the oxide etching process, a hydrophilic treatment process is performed on the initial work function layer formed in the first gate opening. As such, the contact area between the plurality of initial work function layers and the solution used in the oxide etching process may be increased, and thus the etching rate of the plurality of initial work function layers may be increased.

Further, prior to performing the main etching process, a hydrophilic treatment process is performed on the initial work function layer formed in the first gate opening. As such, the contact area between the plurality of initial work function layers and the solution used in the main etching process may be increased, and thus the etching rate of the plurality of initial work function layers may be increased.

Further, after the initial work function layer is etched by the main etching process, deionized (DI) water is adopted to rinse the first gate opening. Using DI water to rinse the first gate opening may be able to remove a substantial portion of the reaction by-products generated in the first gate opening. Thus, the etching efficiency may be improved when subsequently repeating the combined etching process by cycling the oxide etching process and the main etching process.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the present disclosure, which are illustrated in the accompanying drawings. Wherever possible, the same reference numbers will be used throughout the drawings to refer to the same or like parts.

According to the existing technology, the performance of transistors fabricated by existing methods may still need to be improved. In the following, further analysis and description will be made in combination with some examples.

Figure 1:
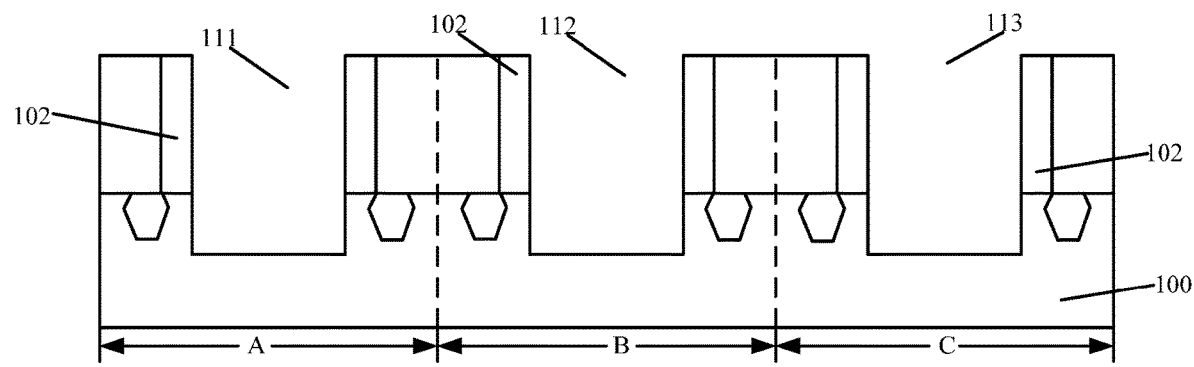
FIG. 1 to FIG. 4 illustrate schematic cross-sectional views of semiconductor structures at certain stages of a fabrication process of a semiconductor structure.

FIG. 1 to FIG. 4 illustrate schematic cross-sectional views of semiconductor structures at certain stages of a fabrication process of a semiconductor structure. Referring to FIG. 1, a substrate 100 is provided. A plurality of fin structures is formed over the substrate 100. The substrate 100 includes a first region A, a second region B, and a third region C. A first initial gate opening 111 is formed in a fin structure of the first region A. A second initial gate opening 112 is formed in a fin structure of the second region B. A third initial gate opening 113 is formed in a fin structure of the third region C. A sidewall spacer 102 is formed on the sidewalls of the first initial gate opening 111, the second initial gate opening 112, and the third initial gate opening 113.

Figure 2:
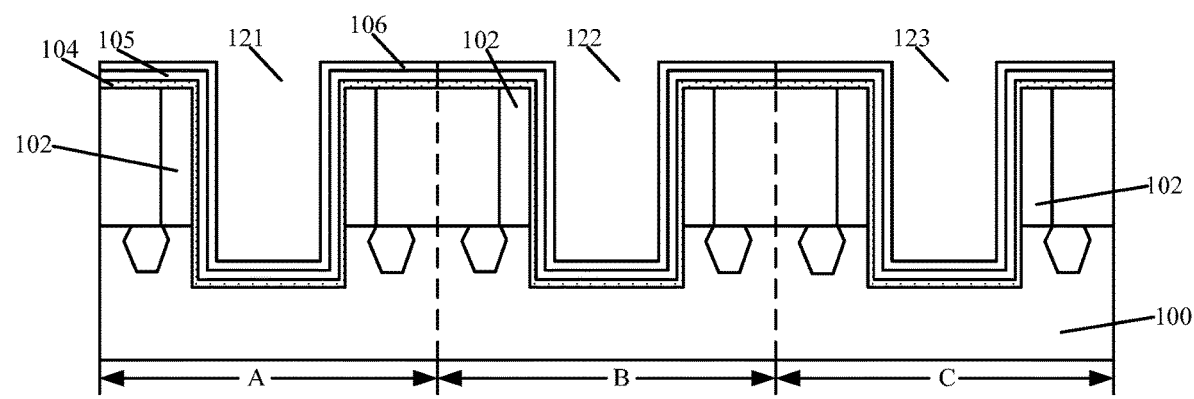

Referring to FIG. 2, a dielectric layer 104 (with a relative dielectric constant K greater than 3.9) is formed on the inner surfaces of the first initial gate opening 111, the second initial gate opening 112, and the third initial gate opening 113. A stop layer 105 is formed over the dielectric layer 104. A first work function layer 106 is formed over the stop layer 105. As such, the first initial gate opening 111 forms a first initial opening 121, the second initial gate opening 112 forms a second initial opening 122, and the third gate opening 113 forms a third initial opening 123.

Figure 3:
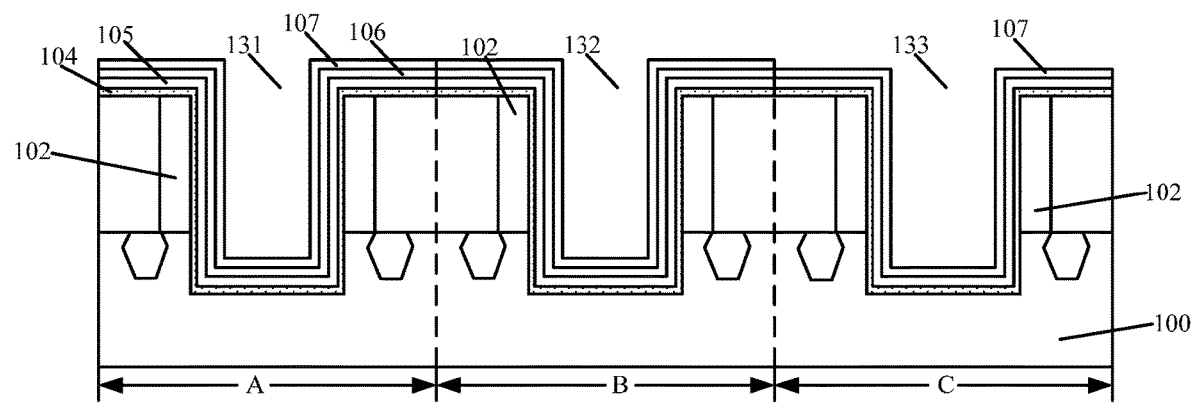

Referring to FIG. 3, the first work function layer 106 formed on the inner surface of the third initial opening 123 is removed. After the first work function layer 106 formed on the inner surface of the third initial opening 123 is removed, a second work function layer 107 is formed on the inner surface of the first initial opening 121, the inner surface of the second initial opening 122, and the inner surface of the third initial opening 123. As such, the first initial opening 121 forms a first opening 131, the second initial opening 122 forms a second opening 132, and the third opening 123 forms a third opening 133.

Figure 4:
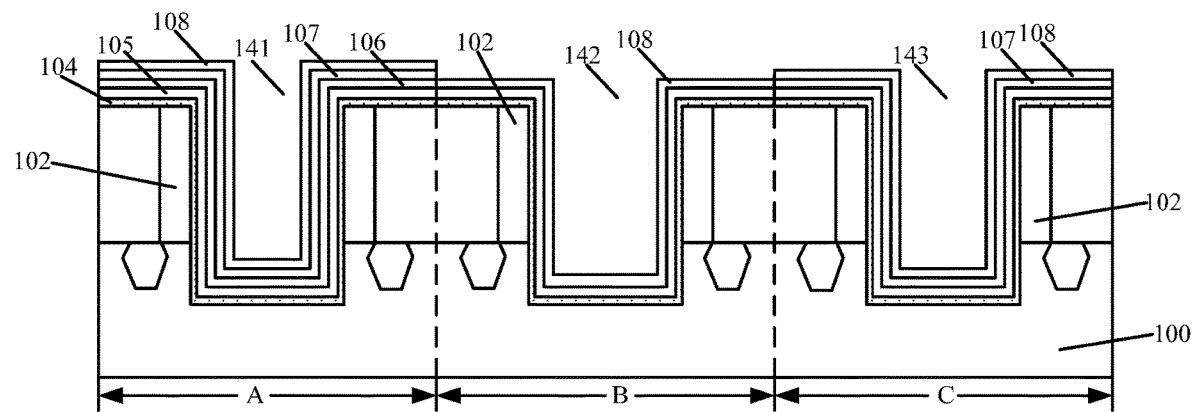

Referring to FIG. 4, the second work function layer 107 and the first work function layer 106 formed on the inner surface of the second opening 132 are removed. After the second work function layer 107 and the first work function layer 106 formed on the inner surface of the second opening 132 are removed, a third work function layer 108 is formed on the inner surface of the first opening 131, the inner surface of the second opening 132, and the inner surface of the third opening 133. As such, the first opening 131 forms a first gate opening 141, the second opening 132 forms a second gate opening 142, and the third opening 133 forms a third gate opening 143.

During the fabrication process of the semiconductor structure, a work function layer with a first thickness needs to be formed in the first region A, a work function layer with a second thickness needs to be formed in the second region B, and a work function layer with a third thickness needs to be formed in the third region C. The first thickness is larger than the second thickness, and the second thickness is larger than the third thickness. Because the depth-to-width ratio of the first initial gate opening 111, the second initial gate opening 112, and the third initial opening 113 is relatively large, in order to accurately control the thickness of the different work function layers, the work function layers are formed in stages after calculation. For example, a deposition process is repeated in the first region A, and the unnecessary work function layers in the second region B and the third region C are removed through an etching process. The deposition process and the etching process are repeated to finally form the required work function layers with the first thickness, the second thickness, and the third thickness, respectively.

However, in the course of repeating the deposition process and etching process, the material of the work function layers may be easily oxidized, and thus may form an oxide. The material of the work function layers includes titanium nitride ($TiN_x$). Then, the first work function layer 106 is actually a combination of a titanium nitride layer and a titanium oxynitride layer, the second work function layer 107 is actually a combination of a titanium nitride layer and a titanium oxynitride layer, and the third work function layer 108 is actually a combination of a titanium nitride layer and a titanium oxynitride layer. During a wet etching process to remove the first work function layer 106 that is formed on the inner surface of the third initial opening 123 through, or to remove the second work function layer 107 and the first work function layer 106 that are formed on the inner surface of the second opening 132, because titanium nitride and titanium oxynitride have different etching rates, the etching rates on the surface regions of the first work function layer 106 and the second work function layer 107 are relatively slow, while the etching rates on the bottom regions of the first work function layer 106 and the second work function layer 107 are relatively fast. Therefore, it may be difficult to control the processing parameters for the wet etching process. When the etching is insufficient (e.g. the materials are under etched), the first work function layer 106 or the second work function layer 107 may have residues, which may further affect subsequent fabrication processes. When the etching process is overly performed (e.g., the material is overly-etched), the stop layer 105 and the dielectric layer 104 may be damaged, which may affect the performance of the subsequently formed device.

Moreover, since the first initial gate opening 111, the second initial gate opening 112, and the third initial gate opening 113 have a relatively large depth-to-width ratio, the circulating fluidity of the etching solution is undesired. As such, reaction by-products generated during the wet etching process cannot be carried out in time, such that the residuals of the reaction by-products may also affect the performance of the subsequently formed device.

The present disclosure provides a semiconductor structure and a method for forming the semiconductor structure. The method includes using an oxide etching process to etch the initial work function layer at first, and then using a main etching process to etch the initial work function layer. The oxide etching process may remove the oxidized surface portion of the initial work function layer, such that the subsequent main etching process may be able to neatly remove the initial work function layer. As such, incomplete removal of the initial work function layer, which may affect the performance of the semiconductor device, can be avoided. Therefore, the performance of the semiconductor structure may be improved.

To make the aforementioned objectives, features, and beneficial effects of the present disclosure more comprehensible, specific embodiments of the present disclosure are described in detail with reference to the accompanying drawings.

Figure 13:
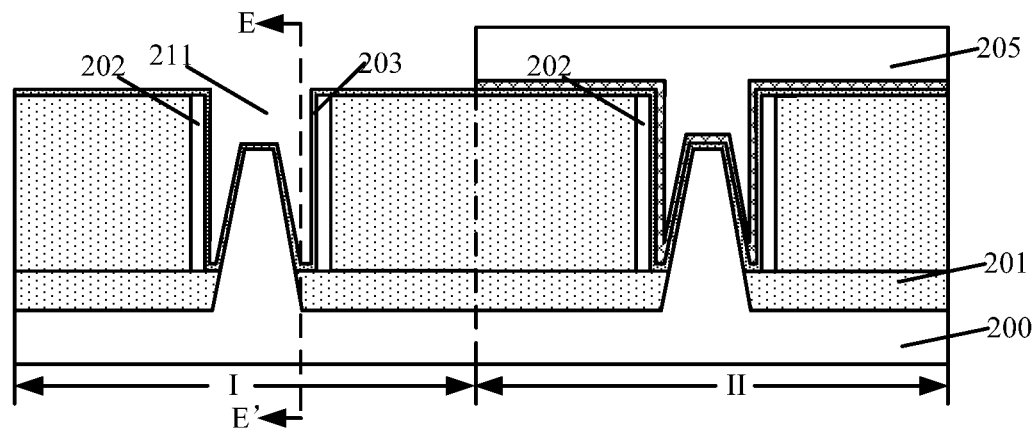
Figure 14:
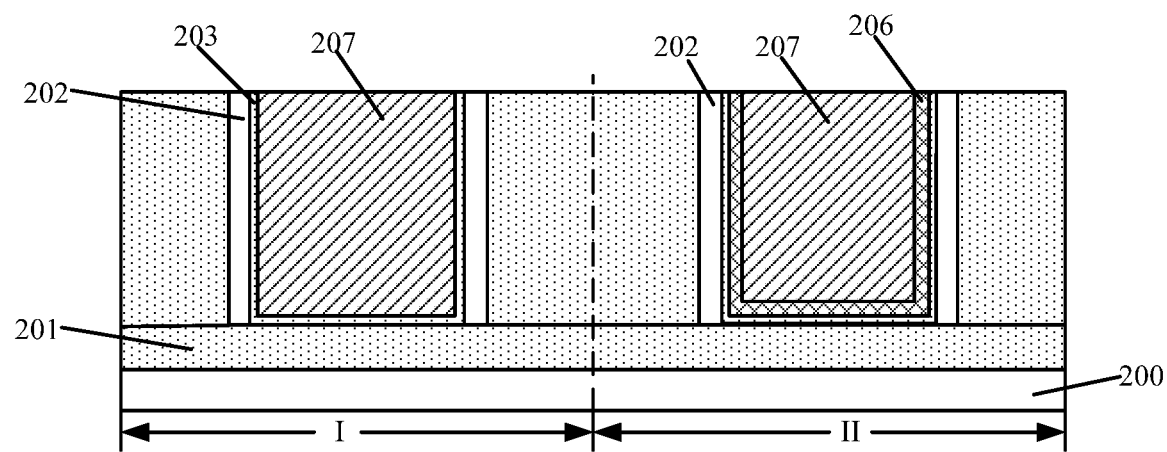
Figure 15:
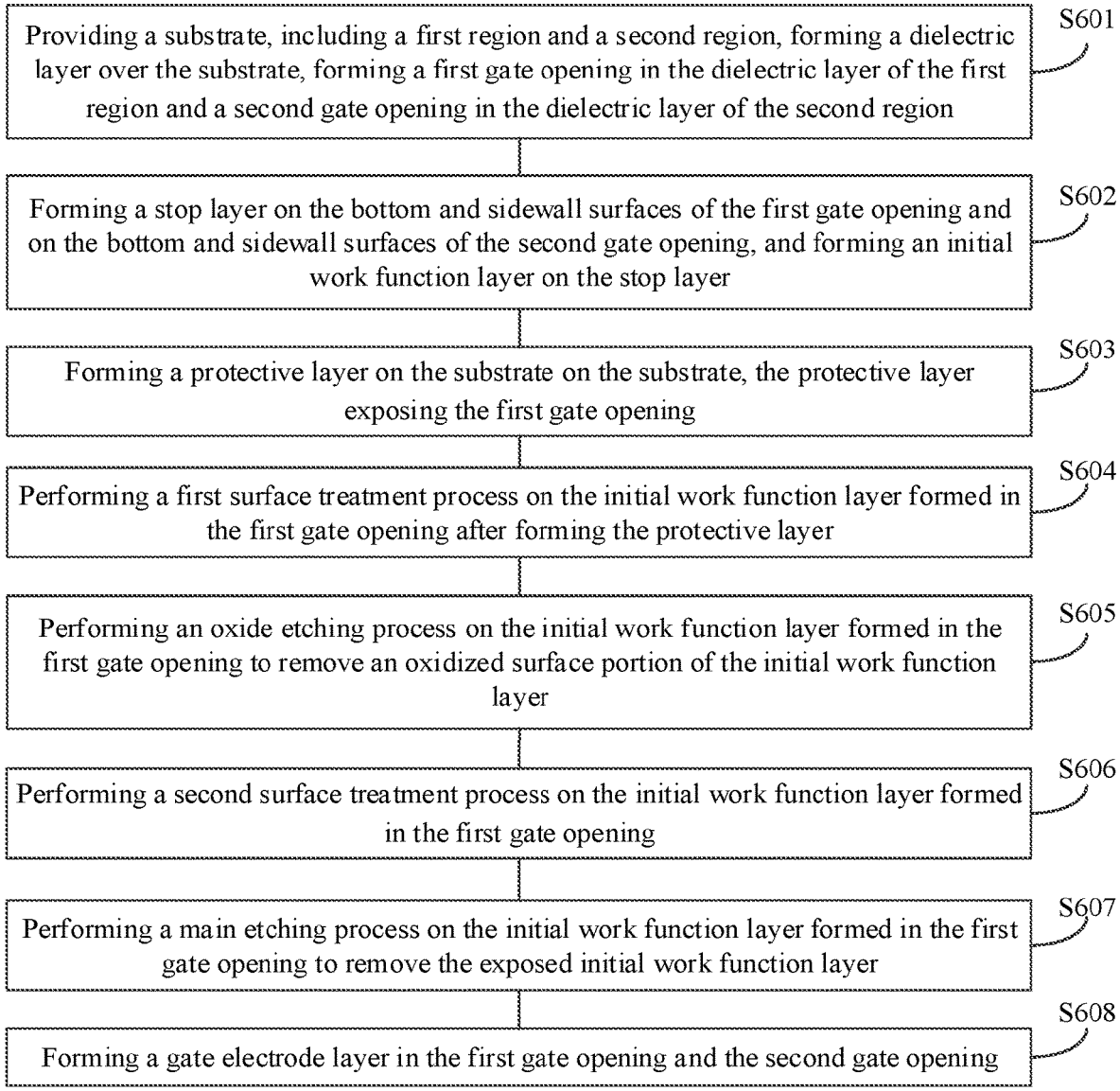
FIG. 15 illustrates a flowchart of an exemplary method for forming a semiconductor structure according to some embodiments in the present disclosure.

FIG. 15 illustrates a flowchart of an exemplary method for forming a semiconductor structure according to some embodiments in the present disclosure. FIG. 5 to FIG. 14 illustrate schematic cross-sectional views of semiconductor structures at certain stages of the exemplary fabrication method.

Figure 5:
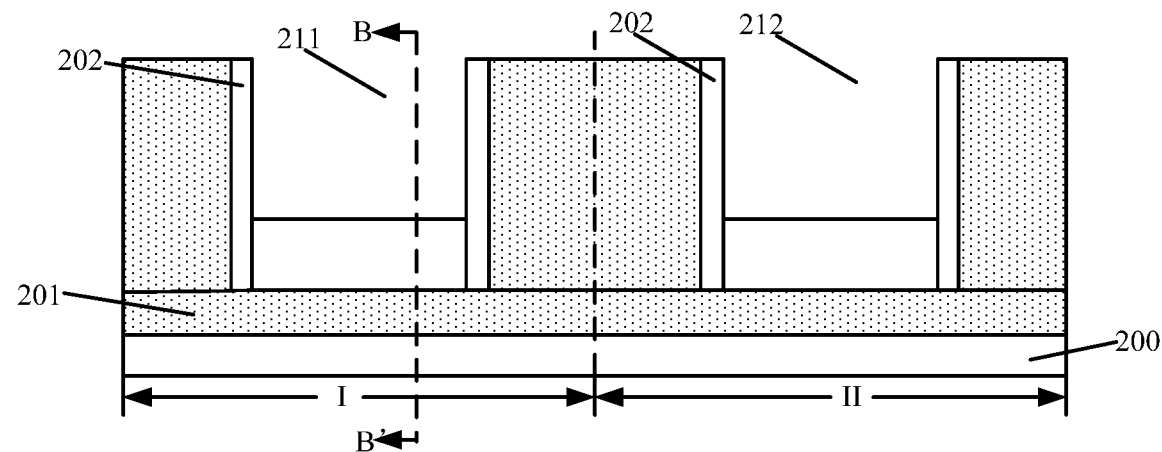
FIG. 5 to FIG. 14 illustrate schematic cross-sectional views of semiconductor structures at certain stages of an exemplary method for fabricating a semiconductor structure according to some embodiments in the present disclosure.
Figure 6:
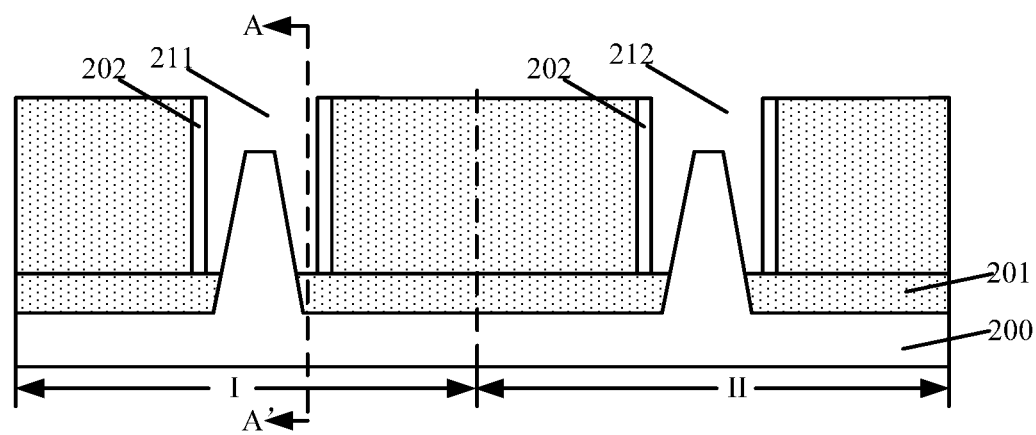

Referring to FIG. 15, in S601, a substrate is provided. FIGS. 5-6 illustrate schematic cross-sectional views of a semiconductor structure according to some embodiments of the present disclosure. Specifically, FIG. 5 illustrates a schematic cross-sectional view of the semiconductor structure shown in FIG. 6 along a section line A-A', and FIG. 6 illustrates a schematic cross-sectional view of the semiconductor structure shown in FIG. 5 along a section line B-B'.

Referring to FIGS. 5-6, the substrate may include a first region I and a second region II. A dielectric layer 201 may be formed over the substrate. A first gate opening 211 may be formed in the dielectric layer 201 of the first region I. A second gate opening 212 may be formed in the dielectric layer 201 of the second region II.

It should be noted that in each of FIG. 5 and FIG. 6, for illustrative purposes, the first gate opening 211 formed in the first region I and the second gate opening 212 formed in the second region II are displayed in a manner where the cross-sectional view of the first gate opening 211 is always to the left of the cross-sectional view of the second gate opening 212. Therefore, the cross-sectional view should not be interpreted as a long a straight line across the first region I and the second region II. Instead, the cross-sectional views of the two different regions (the first region I and the second region II) are respectively along two lines that are parallel to each other. That is, in FIG. 5 and/or FIG. 6, with respect to the center dashed line, the left portion and the right portion of the cross-sectional view may have different depths in the direction pointing into the panel. The same understanding should also be applied to any other cross-sectional views of the present disclosure.

Moreover, it should also be noted that the section line A-A' does not cut through the fin structure; however, in the view direction indicated by the arrows, the sidewall surface and the top profile of the fin structure should be visible in the cross-sectional view. For example, the top profile of the first fin structure is indicated by a line in the first gate opening 211. In subsequent processes, material layers formed in each of the first gate opening 211 and the second gate opening 212 are also formed on the top and sidewall surfaces of the corresponding fin structure.

In one embodiment, the substrate may include a base substrate 200, a first fin structure (not labeled) disposed over the base substrate 200 of the first region I, and a second fin structure (not labeled) disposed over the base substrate 200 of the second region II. The dielectric layer 201 may be formed over the first fin structure, the second fin structure, and the base substrate 200.

In one embodiment, the first gate opening 211 may be formed over the first fin structure, e.g., the first gate opening 211 may expose the first fin structure. Similarly, the second gate opening 212 may be formed over the second fin structure, e.g., the second gate opening 212 may expose the second fin structure.

In one embodiment, the material of the base substrate 200 may include silicon (Si). In other embodiments, the material of the base substrate 200 may include germanium (Ge), silicon-germanium (SiGe), silicon carbide (SiC), gallium arsenide (GaAs), or indium arsenide (InAs).

The material for forming the dielectric layer 201 may include silicon oxide ($SiO_x$) or silicon nitride ($SiN_x$). In one embodiment, the dielectric layer 201 may be made of silicon oxide ($SiO_x$).

In one embodiment, a sidewall spacer 202 may be formed on each of the sidewalls of the first gate opening 211 and the second gate opening 212. The material for forming the sidewall spacer 202 may include silicon nitride ($SiN_x$) or silicon oxide ($SiO_x$). In one embodiment, the sidewall spacer 202 may be made of silicon nitride ($SiN_x$).

In a subsequent fabrication process, one or more initial work function layers may be formed at the bottom of the first gate opening 211 and the bottom of the second gate opening 212.

In one embodiment, a single initial work function layer may be formed at the bottom of the first gate opening 211 and the bottom of the second gate opening 212. In other embodiments, a plurality of initial work function layers may be formed at the bottom of the first gate opening and the bottom of the second gate opening.

Prior to forming the single initial work function layer or the plurality of initial work function layers at the bottoms of the first gate opening 211 and the second gate opening 212, the method may further include forming a stop layer 203 at the bottoms of the first gate opening 211 and the second gate opening 212.

Figure 7:
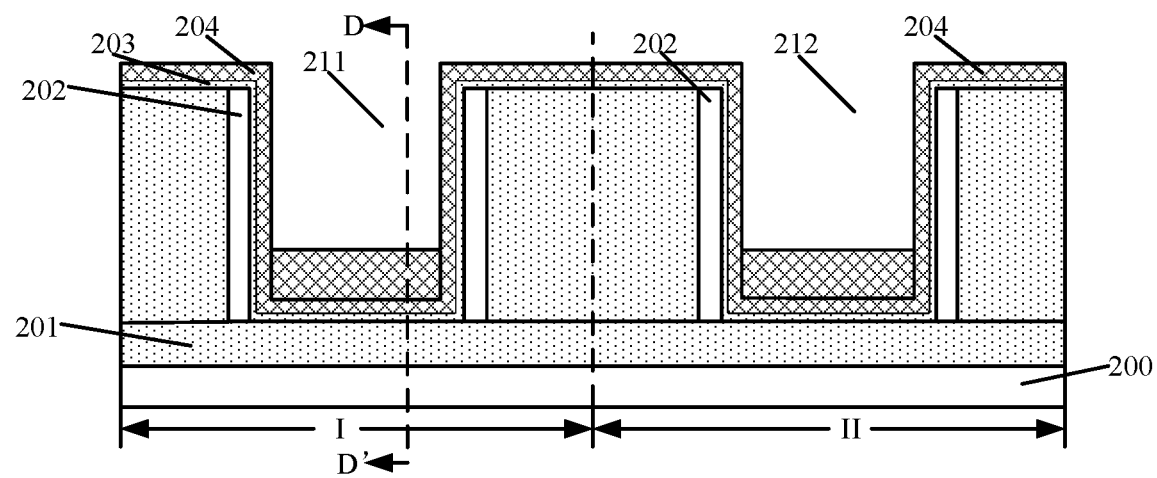
Figure 8:
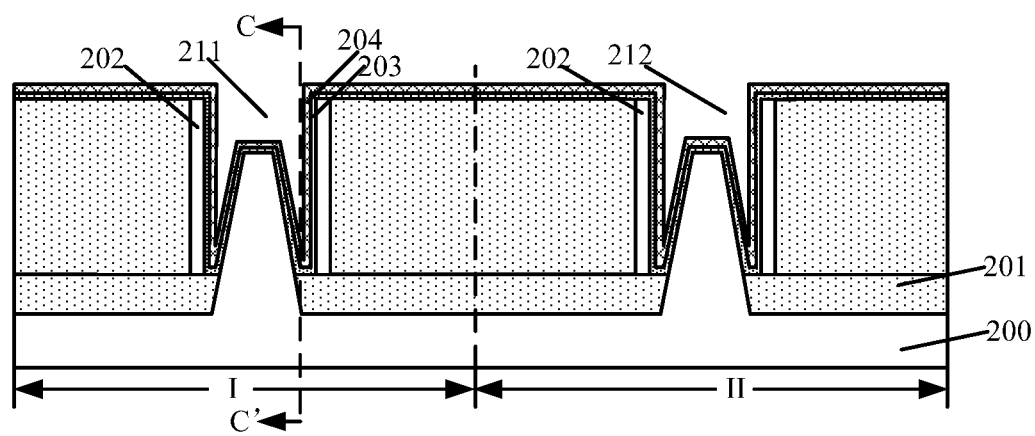

Referring to FIG. 15, in S602, a stop layer may be formed at the bottom and sidewall surfaces of the first gate opening and the second gate opening, and an initial work function layer may be formed on the stop layer. FIGS. 7-8 illustrate schematic cross-sectional views of a semiconductor structure according to some embodiments of the present disclosure. Specifically, FIG. 7 illustrates a schematic cross-sectional view of the semiconductor structure shown in FIG. 8 along a section line C-C', and FIG. 8 illustrates a schematic cross-sectional view of the semiconductor structure shown in FIG. 7 along a section line D-D'.

Referring to FIGS. 7-8, a stop layer 203 may be formed on the bottom and sidewall surfaces of the first gate opening 211 and the second gate opening 212, and an initial work function layer 204 may be formed over the stop layer 203. In one embodiment, the stop layer 203 may serve as an etch stop layer for subsequently removing the initial work function layer 204 that is formed in the first gate opening 211. When the initial work function layer 204 is removed in a subsequent wet etching process, because the initial work function layer 204 is made of a material having an etching selectivity ratio larger than that of the material used for forming the stop layer 203, the stop layer 203 may serve as an etching stop layer for the removal of the initial work function layer 204.

The initial work function layer 204 may provide a material layer for subsequent formation of a work function layer at the bottom and sidewall surfaces of the first gate opening 211 and the second gate opening 212.

The material for forming the initial work function layer 204 may include titanium nitride, titanium aluminide (TiAl), or tantalum nitride ($TaN_x$). In one embodiment, the initial work function layer 204 may be made of titanium nitride.

The initial work function layer 204 may be formed by a deposition process, including a chemical vapor deposition (CVD) process, a physical vapor deposition (PVD) process, and an atomic layer deposition (ALD) process.

In one embodiment, the initial work function layer 204 may be formed by an ALD process. When an ALD process is used to form the initial work function layer 204, the formed initial work function layer 204 may have a uniform thickness and a dense structure.

The thickness of the initial work function layer 204 may not be too small. For example, when the thickness of a single initial work function layer 204 is less than 7 Å, the thickness of the single initial work function layer 204 may not be uniform. The thickness of the initial work function layer 204 may not be too large either. For example, when a plurality of initial work function layers needs to be stacked one over another and the thickness of a single initial work function layer 204 is larger than 15 Å, the thickness of the plurality of initial work function layers may be too large, such that the accuracy of the thickness of each work function layer may be difficult to control when work function layers with different thicknesses are finally formed. Therefore, in one embodiment, the thickness of the initial work function layer 204 may be in a range of approximately 7 Å to 15 Å.

The material for forming the stop layer 203 may include tantalum nitride or a material with a high dielectric constant. Tantalum nitride or the material with a high dielectric constant may be used as a stop layer for the initial work function layer that is made of titanium nitride and/or titanium aluminide. In one embodiments, the stop layer 203 may be made of tantalum nitride. In other embodiments, when the initial work function layer 204 is made of tantalum nitride, the stop layer 203 may be made of a material having a high dielectric constant. The high dielectric constant material may include hafnium oxide ($HfO_2$), alumina ($Al_2O_3$), or zirconia ($ZrO_2$).

The stop layer 203 may be formed by a deposition process including a CVD process, a PVD process, or an ALD process. In one embodiment, the stop layer 203 may be formed by a CVD process. The CVD process may be able to quickly form the stop layer 203 with a uniform thickness.

In one embodiment, prior to forming the stop layer 203 at the bottoms of the first gate opening 211 and the second gate opening 212, the method may further include forming a gate dielectric layer (not shown) at the bottoms of the first gate opening 211 and the second gate opening 212.

The material for forming the gate dielectric layer may be a high-k dielectric material (with a relative dielectric constant greater than 3.9). The high-k dielectric material (with a relative dielectric constant greater than 3.9) may include hafnium oxide ($HfO_2$), alumina ($Al_2O_3$), or zirconia ($ZrO_2$). The gate dielectric layer may be formed by a deposition process including a CVD process, a PVD process, or an ALD process.

Further, at least one cycle of a combined etching process may be adopted to etch the initial work function layer formed in the first gate opening 211 to form a work function layer in the second gate opening 212.

In one embodiment, the combined etching process may be cycled once (e.g., performed a single time) to remove the initial work function layer 204 formed in the first gate opening 211. As such, a work function layer may be formed in the second gate opening 212 from the initial work function layer 204.

In other embodiments, the combined etching process may be cycled multiple times (e.g., repeated multiple times) to etch the initial work function layer formed in the first gate opening. When the initial work function layer includes a plurality of layers, the number of cycling times of the combined etching process may be smaller than or equal to the number of layers that form the initial work function layer.

The primary processing steps in each cycle of the combined etching process may include using an oxide etching process to etch the initial work function layer and, after the oxide etching process, using a main etching process to etch the remaining portion of initial work function layer. As such, an exposed initial work function layer may be completely removed. In the following, a detailed description of each cycle of the combined etching process will be provided.

Figure 9:
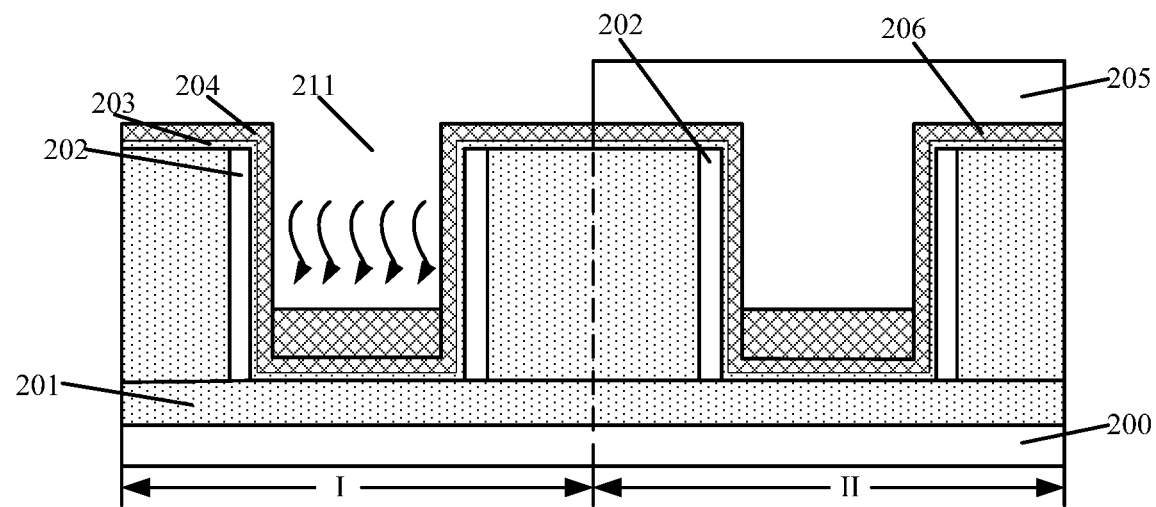

Returning back to FIG. 15, in S603, a protective layer may be formed on the substrate, and the protective layer may expose the first gate opening. FIG. 9 illustrates a schematic cross-sectional view of a semiconductor structure according to some embodiments of the present disclosure.

Referring to FIG. 9, a protective layer 205 may be formed on the surface of the substrate. The protective layer 205 may expose the first gate opening 211. The protective layer 205 may be used to protect an initial work function layer formed subsequently in the second gate opening 212 from being etched during cycling the combined etching process. In one embodiment, the protective layer 205 may be made of a photoresist.

Further, returning to FIG. 15, in S604, a first surface treatment process is performed on the initial work function layer formed in the first gate opening after the protective layer is formed. A corresponding structure consistent with some embodiments of the present disclosure is shown in FIG. 9.

Referring to FIG. 9, after forming the protective layer 205, a first surface treatment process may be performed on the initial work function layer 204 formed in the first gate opening 211. In one embodiment, the first surface treatment process may be a hydrophilic treatment process.

The hydrophilic treatment process may reduce the surface tension of the initial work function layer 204 in the first gate opening 211, thereby improving the surface hydrophilicity of the initial work function layer 204. Therefore, in a subsequent oxide etching process, the contact area between the surface of the initial work function layer 204 and the etching solution used in the oxide etching process may increase. As such, during the oxide etching process, the etching efficiency may be improved.

In one embodiment, the solution used in the hydrophilic treatment process may be a solution including isopropanol (e.g. an isopropanol solution). The mass concentration of the isopropanol solution may be in a range of approximately 10% to 100%. The mass concentration of the isopropanol solution may not be too low, otherwise the hydrophilic treatment process may not have desired effect on the surface of the initial work function layer 204.

The surface tension of the isopropanol solution may be small, while the surface tension of the etching solution used in the oxide etching process may be large. Therefore, after the isopropanol solution wets the surface of the initial work function layer 204, the surface tension of the initial work function layer 204 and the surface tension of the etching solution used in the oxide etching process can be balanced, such that a desired hydrophilic effect may be achieved.

In other embodiments, the solution used in the hydrophilic treatment process may include an ethanol solution or an acetone solution. The mass concentration of the ethanol solution may be in a range of approximately 10% to 100%, and the mass concentration of the acetone solution may be in a range of approximately 10% to 100%.

The processing time of the first surface treatment process may not be too long or too short. For example, when the processing time of the first surface treatment process is less than 10 s, improvement on the surface hydrophilicity of the initial work function layer 204 formed in the first gate opening 211 may not be sufficient. However, when the processing time of the first surface treatment process is longer than 25 s, the production efficiency may be reduced, and the production capacity may be wasted. Therefore, in one embodiment, the processing time of the first surface treatment process may be in a range of approximately 10 s to 25 s.

Figure 10:
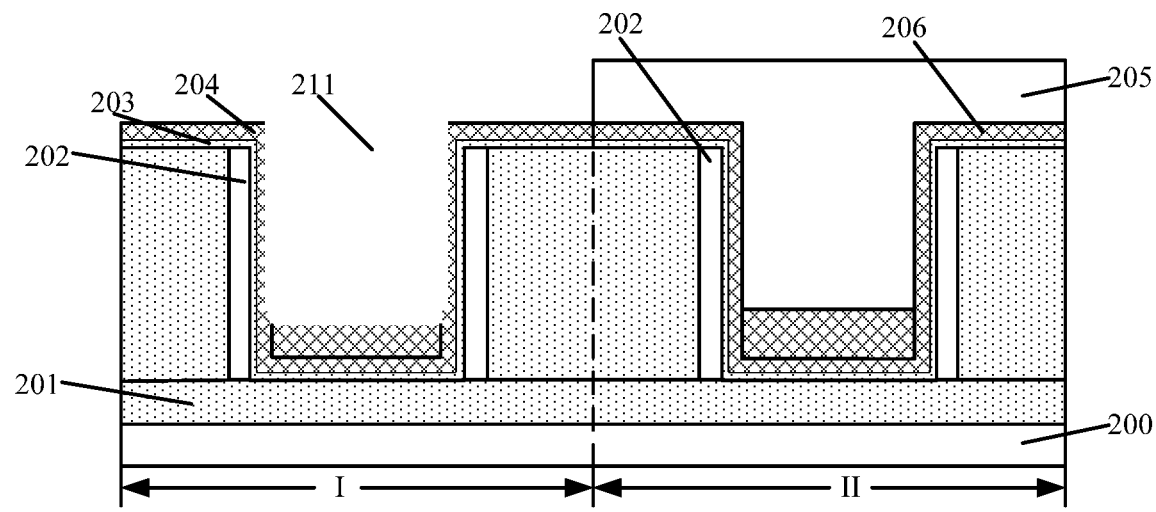

Further, returning to FIG. 15, in S605, after the completion of the first surface treatment process, an oxidized surface portion of the initial work function layer may be removed by performing an oxide etching process on the initial work function layer formed in the first gate opening. FIG. 10 illustrates a schematic cross-sectional view of a semiconductor structure according to some embodiments of the present disclosure.

Referring to FIG. 10, after performing the first surface treatment process, the initial work function layer 204 formed in the first gate opening 211 may be etched by an oxide etching process. The oxide etching process may be performed to remove an oxidized surface portion of the initial work function layer 204. Therefore, after removing the oxide layer on the surface of the initial work function layer 204, and the initial work function layer 204 may then be removed through a subsequently-performed main etching process. As such, the initial work function layer 204 can be removed completely.

In one embodiment, the oxide etching process may include a first wet etching process. The first wet etching process may demonstrate an isotropic etching effect, and may be able to quickly and efficiently remove the oxide layer formed on the surface of the initial work function layer 204 that is disposed on the bottom and sidewall surfaces of the first gate opening 211.

In one embodiment, the etching solution used in the first wet etching process may include a hydrogen fluoride solution. The volume ratio of hydrogen fluoride to water in the hydrogen fluoride solution may be approximately 1:200.

The oxide of the initial work function layer 204 may be an alkaline oxide, and the hydrogen fluoride solution is an acid solution. Therefore, the hydrogen fluoride solution may be able to quickly react with the oxide of the initial work function layer 204, and thus the oxide layer formed on the surface of the initial work function layer 204 can be quickly removed. In the meantime, the etching effect of the hydrogen fluoride solution may also be easily controlled.

In other embodiments, the etching solution used in the first wet etching process may include a mixed solution of ammonia ($NH_4OH$) and hydrogen peroxide ($H_2O_2$) at a temperature in a range of approximately 50° C. to 70° C., a mixed solution of hydrogen chloride (HCl) and $H_2O_2$ at a temperature in a range of approximately 50° C. to 70° C., or a mixed solution of phosphoric acid ($H_3PO_4$) and $H_2O_2$ at a temperature in a range of approximately 50° C. to 70° C.

The reaction time of the first wet etching process may not be too long or too short. For example, when the reaction time of the first wet etching process is less than 10 s, the oxide of the initial work function layer 204 may not be completely removed, which may further affect the effect of the main etching process that is subsequently performed. However, when the reaction time of the first wet etching process is longer than 60 s, the production efficiency may be reduced and the production capacity may not be desired. Therefore, in one embodiment, the reaction time of the first wet etching process may be in a range of approximately 10 s to 60 s.

Figure 11:
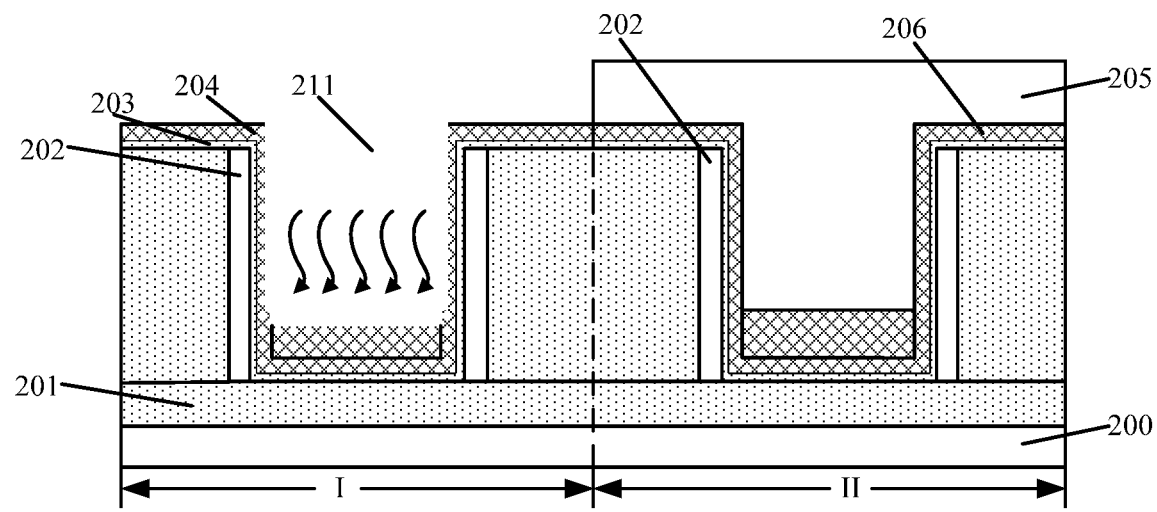

Referring to FIG. 15, in S606, after performing the oxide etching process, a second surface treatment process may be performed on the initial work function layer formed in the first gate opening. FIG. 11 illustrates a schematic cross-sectional view of a semiconductor structure according to some embodiments of the present disclosure.

Referring to FIG. 11, after the completion of the oxide etching process, a second surface treatment process may be performed on the initial work function layer 204 that is formed in the first gate opening 211. In one embodiment, the second surface treatment process may be a hydrophilic treatment process.

The hydrophilic treatment process may reduce the surface tension of the initial work function layer 204 in the first gate opening 211, thereby improving the surface hydrophilicity of the initial work function layer 204. Therefore, in a subsequent main etching process, the contact area between the surface of the initial work function layer 204 and the etching solution used in the main etching process may increase. As such, during the main etching process, the etching efficiency may be improved.

In one embodiment, the solution used in the hydrophilic treatment process may be a solution including isopropanol (e.g. an isopropanol solution). The mass concentration of the isopropanol solution may be in a range of approximately 10% to 100%. The mass concentration of the isopropanol solution may not be too low, otherwise the hydrophilic treatment process may not have desired effect on the surface of the initial work function layer 204.

The surface tension of the isopropanol solution may be small, while the surface tension of the etching solution used in the main etching process may be large. Therefore, after the isopropanol solution wets the surface of the initial work function layer 204, the surface tension of the initial work function layer 204 and the surface tension of the etching solution used in the main etching process can be balanced, such that a desired hydrophilic effect may be achieved.

In other embodiments, the solution used in the hydrophilic treatment process may include an ethanol solution or an acetone solution. The mass concentration of the ethanol solution may be in a range of approximately 10% to 100%, and the mass concentration of the acetone solution may be in a range of approximately 10% to 100%.

The processing time of the second surface treatment process may not be too long or too short. For example, when the processing time of the second surface treatment process is less than 10 s, improvement on the surface hydrophilicity of the initial work function layer 204 formed in the first gate opening 211 may not be sufficient. However, when the processing time of the second surface treatment process is longer than 25 s, the production efficiency may be reduced, and the production capacity may be wasted. Therefore, in one embodiment, the processing time of the second surface treatment process may be in a range of approximately 10 s to 25 s.

Figure 12:
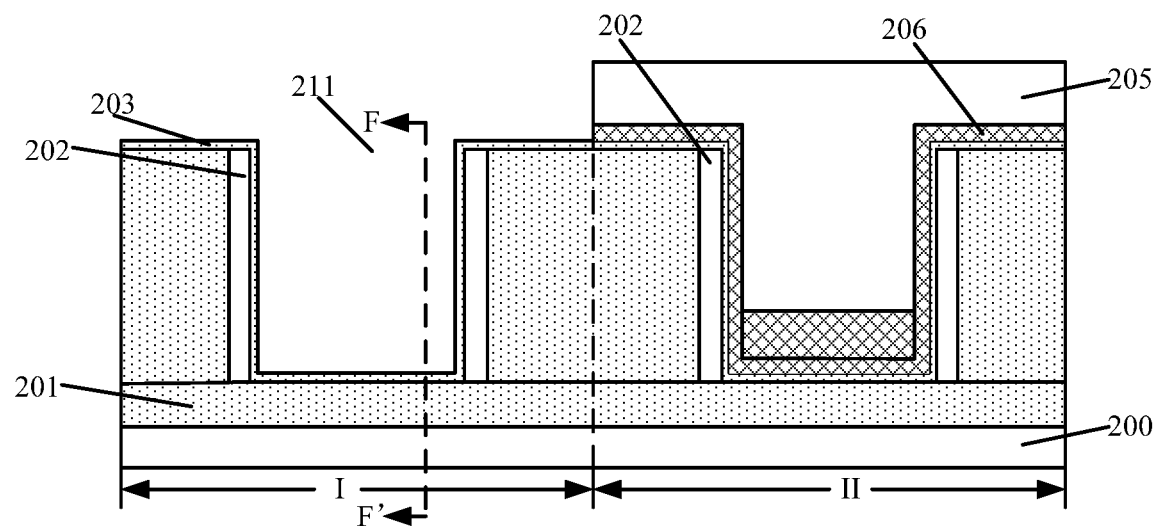

Further, returning to FIG. 15, in S607, after performing the second surface treatment process on the initial work function layer formed in the first gate opening, the initial work function layer may be etched by a main etching process to remove the exposed initial work function layer. FIGS. 12-13 illustrate schematic cross-sectional views of a semiconductor structure according to some embodiments of the present disclosure. Specifically, FIG. 12 illustrates a schematic cross-sectional view of the semiconductor structure shown in FIG. 13 along a section line E-E', and FIG. 13 illustrates a schematic cross-sectional view of the semiconductor structure shown in FIG. 12 along a section line F-F'.

Referring to FIGS. 12-13, after performing the second surface treatment process, a main etching process may be performed on the initial work function layer 204 to remove the exposed layer of the initial work function layer 204. In one embodiment, the main etching process may be performed to remove the initial work function layer 204.

In one embodiment, the main etching process may include a second wet etching process. The second wet etching process may demonstrate an isotropic etching effect, and may be able to quickly and efficiently remove the oxide layer formed on the surface of the initial work function layer 204 that is disposed on the bottom and sidewall surfaces of the first gate opening 211.

The etching solution used in the second wet etching process may include a hydrogen peroxide solution, a mixed solution of ammonia water and hydrogen peroxide, or a mixed solution of hydrogen chloride and hydrogen peroxide. In one embodiment, the etching solution used in the second wet etching process may include a hydrogen peroxide solution, and the temperature of the hydrogen peroxide solution may be in a range of approximately 50° C. to 80° C.

The reaction time of the second wet etching process may not be too long or too short. For example, when the reaction time of the second wet etching process is less than 15 s, the initial work function layer 204 may not be completely removed, which may further affect the performance of the formed devices. However, when the reaction time of the second wet etching process is longer than 30 s, the excessively long reaction time may result in over etching, and thus cause damages to the fin structures. In addition, the excessively long reaction time may also reduce the production efficiency and waste the production capacity. Therefore, in one embodiment, the reaction time of the second wet etching process may be in a range of approximately 15 s to 30 s.

After the initial work function layer 204 is etched by the main etching process, the first gate opening 211 is rinsed with deionized (DI) water.

In one embodiment, using DI water to rinse the first gate opening 211 may be able to remove a substantial portion of the reaction by-products generated in the first gate opening 211. Thus, the etching efficiency may be improved when subsequently repeating the combined etching process by cycling the oxide etching process and the main etching process.

As such, the initial work function layer 204 is first etched by performing the oxide etching process, and then the remaining portion of the initial work function layer is etched by performing the main etching process. As such, the initial work function layer 204 may be completely removed, and thus the performance of the semiconductor device may be prevented from being degraded due to incomplete removal of the initial work function layer. As such, the performance of the formed semiconductor structure may be improved.

In other embodiments, when the initial work function layer formed in the first gate opening is etched by cycling the combined etching process multiple times, each cycle of the combined etching process may include exemplary fabrication steps schematically shown in FIGS. 7-10.

When the initial work function layer includes a plurality of layers, the number of cycling times of the combined etching process may be smaller than or equal to the number of layers that form the initial work function layer.

After the initial work function layer 204 in the first gate opening 211 is etched by cycling the combined etching process one or more times to form a work function layer 206 in the first gate opening 211, the method may further include performing a drying treatment process on the substrate. The drying treatment process may include electric hot-plate heating drying, air heating drying, hydrothermal drying, or chemical reagent dehydration treatment. The reagent used for the chemical reagent dehydration treatment may include an isopropanol solution at a temperature in a range of approximately 50° C. to 75° C.

In one embodiment, the substrate drying treatment may include chemical reagent dehydration treatment. The reagent used for the chemical reagent dehydration treatment may include an isopropanol solution at a temperature in a range of approximately 50° C. to 75° C.

Isopropanol is a colorless and transparent liquid with low surface tension, such that isopropanol can dehydrate the substrate to achieve the of drying purpose and facilitate subsequent processes.

After an exposed initial work function layer 204 in the first gate opening 211 is removed, the protective layer 205 may be removed to expose the second gate opening 212. In one embodiment, the process for removing the protective layer 205 may include an ashing process.

Further, returning to FIG. 15, in S608, after a work function layer is formed in the second gate opening, a gate electrode layer may be formed in the first gate opening and the second gate opening. FIG. 14 illustrates a schematic cross-sectional view of a semiconductor structure according to some embodiments of the present disclosure.

Referring to FIG. 14, after forming the work function layer 206 in the second gate opening 212, a gate electrode layer 207 may be formed in the first gate opening 211 and the second gate opening 212. The gate electrode layer 207 and the sidewall spacer 202 may together form a gate structure.

The method for forming the gate electrode layer 207 may include the following exemplary steps. First, a gate material layer (not shown) may be formed in the first gate opening 211 and the second gate opening 212 and over the substrate. Then, the gate material layer may be planarized until the dielectric layer 201 is exposed. As such, the gate electrode layer 207 may be formed in the first gate opening 211 and the second gate opening 212.

The gate electrode layer 207 may be made of a material including polycrystalline silicon, metal, or the like. In one embodiment, the gate electrode layer may be made of a metal. The metal may include tantalum, tungsten, tantalum nitride, or titanium nitride, or a combination thereof.

In one embodiment, the gate material layer may be formed by a deposition process, including at least one of a PVD process, a CVD process, or an ALD process.

As such, in the formed semiconductor structure, the gate structure in the first region I may and the gate structure in the second region II have different work function layers. For example, the thickness of the work function layer formed for the gate structure in the first region I may be different from the thickness of the work function layer formed for the gate structure in the second region II. As such, a semiconductor structure with different functions may be formed over the same substrate.

Figure 21:
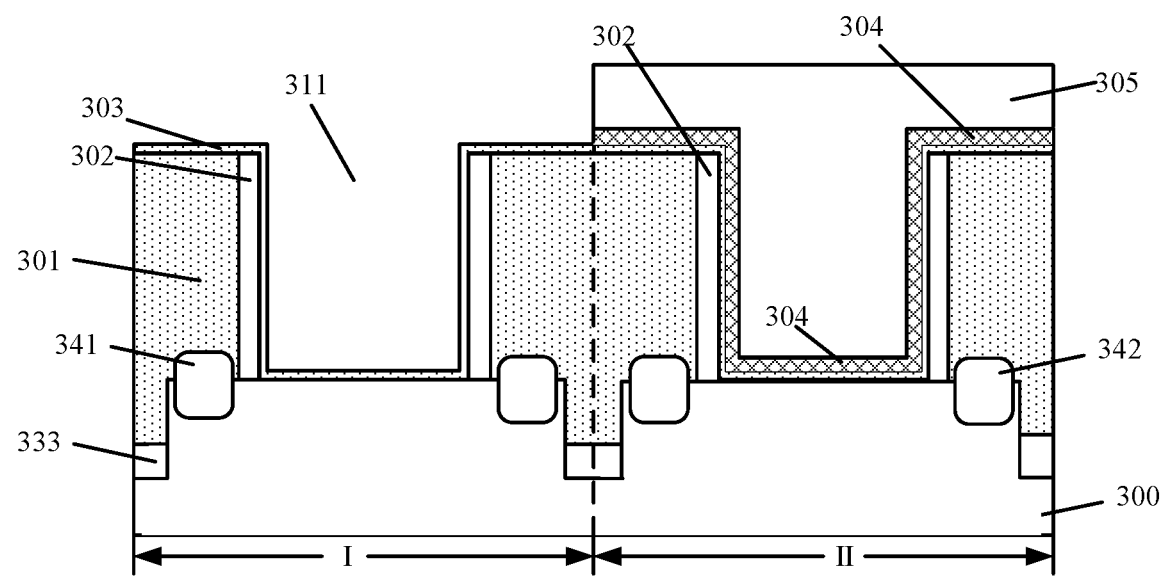
Figure 22:
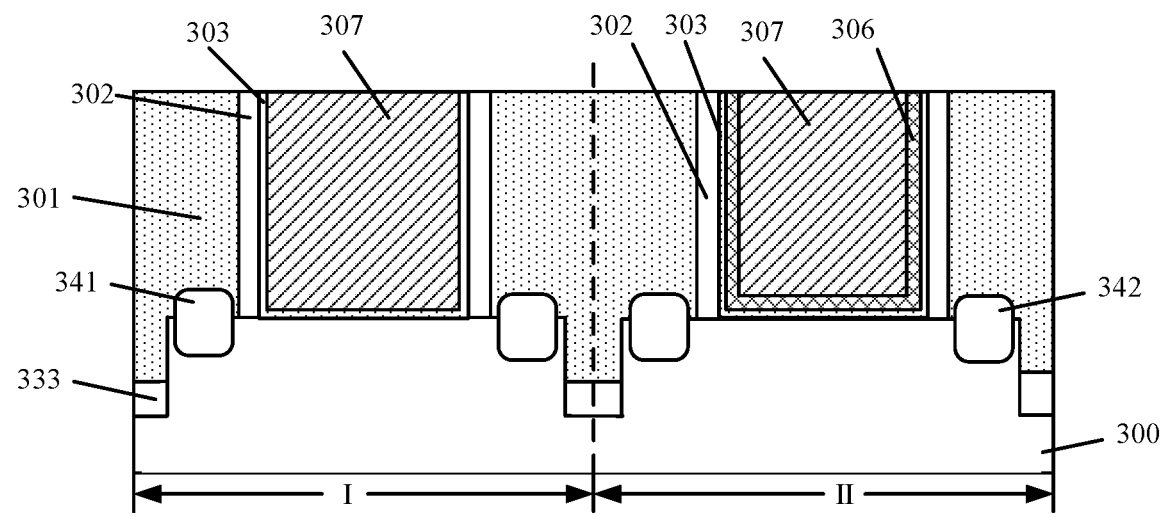
Figure 23:
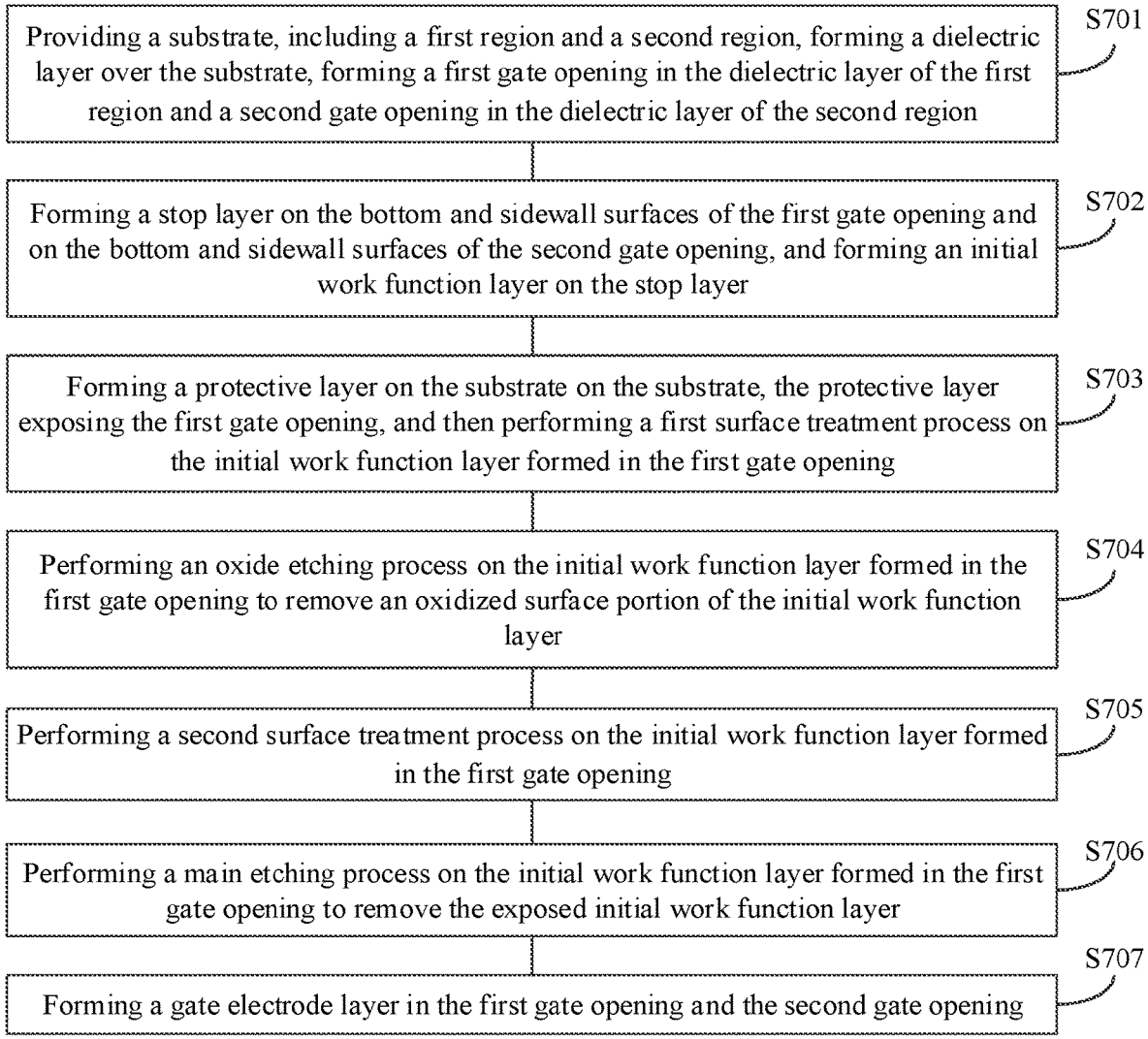
FIG. 23 illustrates a flowchart of an exemplary method for forming a semiconductor structure according to some embodiments in the present disclosure.

The present disclosure provides a method for fabricating semiconductor structures. FIG. 23 illustrates a flowchart of an exemplary method for forming a semiconductor structure according to some embodiments in the present disclosure. FIG. 16 to FIG. 22 illustrate schematic cross-sectional views of semiconductor structures at certain stages of the exemplary fabrication method.

Figure 16:
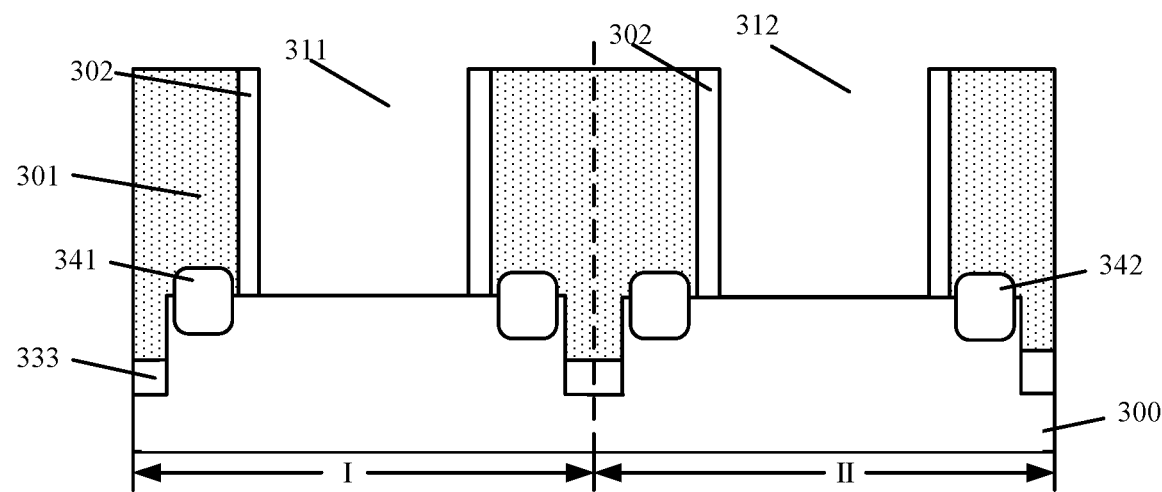
FIG. 16 to FIG. 22 illustrate schematic cross-sectional views of semiconductor structures at certain stages of an exemplary method for fabricating a semiconductor structure according to some embodiments in the present disclosure.

Referring to FIG. 23, in S701, a substrate including a first region and a second region may be provided, a dielectric layer may be formed over the substrate, a first gate opening may be formed in the dielectric layer of the first region, and a second gate opening may be formed in the dielectric layer of the second region. FIG. 16 illustrates a schematic cross-sectional view of a semiconductor structure consistent with some embodiments of the present disclosure.

Referring to FIG. 16, a substrate may be provided. The substrate may include a first region I and a second region II. A dielectric layer 301 may be formed over the substrate. A first gate opening 311 may be formed in the dielectric layer 301 of the first region I. A second gate opening 312 may be formed in the dielectric layer 301 of the second region II.

In one embodiment, the substrate may include a base substrate 300, a first fin structure (not labeled) disposed over the base substrate 300 of the first region I, and a second fin structure (not labeled) disposed over the base substrate 300 of the second region II. The dielectric layer 301 may be formed over the first fin structure, the second fin structure, and the base substrate 300. It should be noted that the cross-sectional view of the semiconductor structure shown in FIG. 16 is along the length direction of the first and the second fin structures.

In one embodiment, the first gate opening 311 may be formed over the first fin structure, e.g., the first gate opening 311 may expose the first fin structure. Similarly, the second gate opening 312 may be formed over the second fin structure, e.g., the second gate opening 312 may expose the second fin structure.

In one embodiment, the material of the base substrate 300 may include silicon (Si). In other embodiments, the material of the base substrate 300 may include germanium (Ge), silicon-germanium (SiGe), silicon carbide (SiC), gallium arsenide (GaAs), or indium arsenide (InAs).

The material for forming the dielectric layer 301 may include silicon oxide ($SiO_x$) or silicon nitride ($SiN_x$). In one embodiment, the dielectric layer 301 may be made of silicon oxide ($SiO_x$).

In one embodiment, a sidewall spacer 302 may be formed on each of the sidewalls of the first gate opening 311 and the second gate opening 312. The material for forming the sidewall spacer 302 may include silicon nitride ($SiN_x$) or silicon oxide ($SiO_x$). In one embodiment, the sidewall spacer 302 may be made of silicon nitride ($SiN_x$).

In one embodiment, an isolation layer 333 may be formed on the base substrate 300. The isolation layer 333 may cover a portion of the sidewall surfaces of the first fin structure and the second fin structure, and the top surface of the isolation layer 333 may be lower than the top surfaces of the first fin structure and the second fin structure.

In one embodiment, a first source/drain doped region 341 may be formed in the first fin structure on each side of the first gate opening 311. The first source/drain doped region 341 may be separated from the sidewall of the first gate opening 311 by a corresponding sidewall spacer 302. Similarly, a second source/drain doped region 342 may be formed in the second fin structure on each side of the second gate opening 312. The second source/drain doped region 341 may be separated from the sidewall of the second gate opening 312 by a corresponding sidewall spacer 302.

Figure 17:
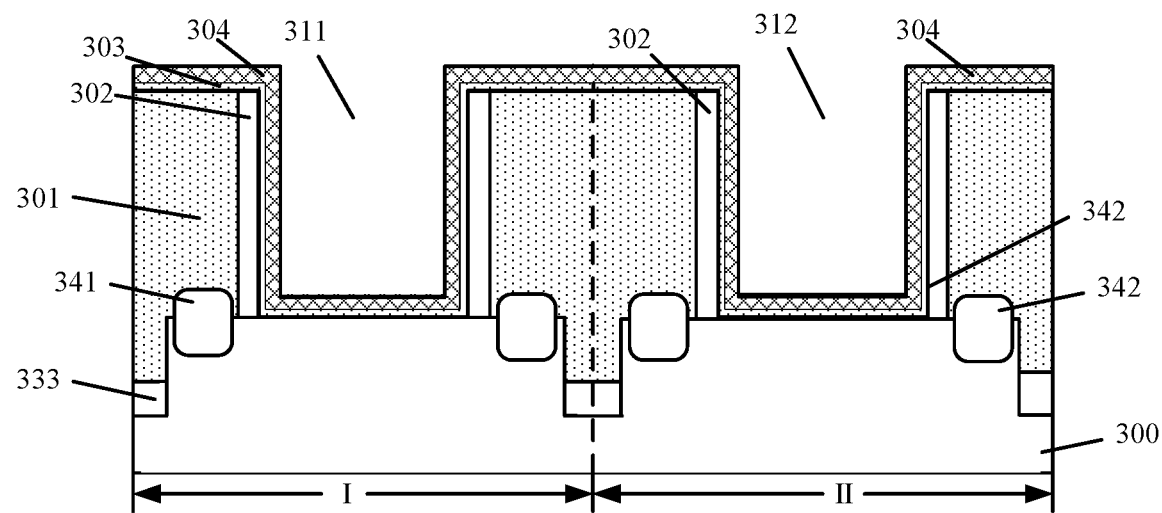

Further, returning to FIG. 23, in S702, a stop layer may be formed on the bottom and sidewall surfaces of the first gate opening, the bottom and sidewall surfaces of the second gate opening, and the surface of the dielectric layer, and then an initial work function layer may be formed on the stop layer. FIG. 17 illustrates a schematic cross-sectional view of a semiconductor structure according to some embodiments of the present disclosure.

Referring to FIG. 17, a stop layer 303 may be formed on the bottom and sidewall surfaces of the first gate opening 311, the bottom and sidewall surfaces of the second gate opening 312, and the surface of the dielectric layer 301. Further, an initial work function layer 304 may be formed on the surface of the stop layer 303. It should be noted that in one embodiment, only a single initial work function layer 304 may be formed, and in other embodiments, the number of initial work function layers formed on the stop layer may be more than one. In one embodiment, the single initial work function layer 304 is described as an example for illustrating the disclosed fabrication method. Moreover, in some examples, the stop layer may not be formed, and thus the initial work function layer may be directly formed on the bottom and sidewall surfaces of the first gate opening 311, the bottom and sidewall surfaces of the second gate opening 312, and the surface of the dielectric layer 301.

In one embodiment, the stop layer 303 may serve as an etch stop layer for subsequently removing the initial work function layer 304 that is formed in the first gate opening 311. When the initial work function layer 304 is removed in a subsequent wet etching process, because the initial work function layer 304 is made of a material having an etching selectivity ratio larger than that of the material used for forming the stop layer 303, the stop layer 303 may serve as an etching stop layer for the removal of the initial work function layer 304.

The initial work function layer 304 may provide a material layer for subsequent formation of a work function layer at the bottom and sidewall surfaces of the first gate opening 311 and the second gate opening 312.

The material for forming the initial work function layer 304 may include titanium nitride, titanium aluminide (TiAl), or tantalum nitride ($TaN_x$). In one embodiment, the initial work function layer 304 may be made of titanium nitride.

The initial work function layer 304 may be formed by a deposition process, including a chemical vapor deposition (CVD) process, a physical vapor deposition (PVD) process, and an atomic layer deposition (ALD) process.

In one embodiment, the initial work function layer 304 may be formed by an ALD process. When an ALD process is used to form the initial work function layer 304, the formed initial work function layer 304 may have a uniform thickness and a dense structure.

The thickness of the initial work function layer 304 may not be too small. For example, when the thickness of a single initial work function layer 304 is less than 7 Å, the thickness of the single initial work function layer 304 may not be uniform. The thickness of the initial work function layer 304 may not be too large either. For example, when a plurality of initial work function layers needs to be stacked one over another and the thickness of a single initial work function layer 304 is larger than 15 Å, the thickness of the plurality of initial work function layers may be too large, such that the accuracy of the thickness of each work function layer may be difficult to control when work function layers with different thicknesses are finally formed. Therefore, in one embodiment, the thickness of the initial work function layer 304 may be in a range of approximately 7 Å to 15 Å.

The material for forming the stop layer 303 may include tantalum nitride or a material with a high dielectric constant. Tantalum nitride or the material with a high dielectric constant may be used as a stop layer for the initial work function layer that is made of titanium nitride and/or titanium aluminide. In one embodiments, the stop layer 303 may be made of tantalum nitride. In other embodiments, when the initial work function layer 304 is made of tantalum nitride, the stop layer 303 may be made of a material having a high dielectric constant. The high dielectric constant material may include hafnium oxide ($HfO_2$), alumina ($Al_2O_3$), or zirconia ($ZrO_2$).

The stop layer 303 may be formed by a deposition process including a CVD process, a PVD process, or an ALD process. In one embodiment, the stop layer 303 may be formed by a CVD process. The CVD process may be able to quickly form the stop layer 303 with a uniform thickness.

In one embodiment, prior to forming the stop layer 303 at the bottoms of the first gate opening 311 and the second gate opening 312, the method may further include forming a gate dielectric layer (not shown) at the bottoms of the first gate opening 311 and the second gate opening 312.

The material for forming the gate dielectric layer may be a high-k dielectric material (with a relative dielectric constant greater than 3.9). The high-k dielectric material (with a relative dielectric constant greater than 3.9) may include hafnium oxide ($HfO_2$), alumina ($Al_2O_3$), or zirconia ($ZrO_2$). The gate dielectric layer may be formed by a deposition process including a CVD process, a PVD process, or an ALD process.

Further, at least one cycle of a combined etching process may be adopted to etch the initial work function layer formed in the first gate opening 211 to form a work function layer in the second gate opening 212.

In one embodiment, the combined etching process may be cycled once (e.g., performed a single time) to remove the initial work function layer 204 formed in the first gate opening 211. As such, a work function layer may be formed in the second gate opening 212 from the initial work function layer 204.

In other embodiments, the combined etching process may be cycled multiple times (e.g., repeated multiple times) to etch the initial work function layer formed in the first gate opening. When the initial work function layer includes a plurality of layers, the number of cycling times of the combined etching process may be smaller than or equal to the number of layers that form the initial work function layer.

The primary processing steps in each cycle of the combined etching process may include using an oxide etching process to etch the initial work function layer and, after the oxide etching process, using a main etching process to etch the remaining portion of initial work function layer. As such, an exposed initial work function layer may be completely removed. In the following, a detailed description of each cycle of the combined etching process will be provided.

Figure 18:
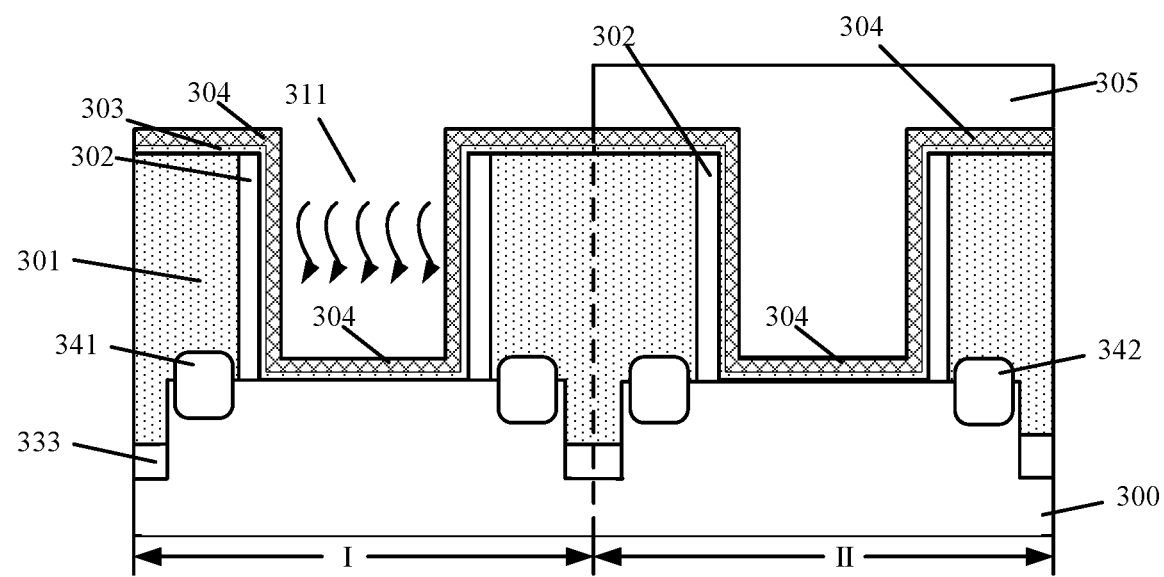

Further, returning to FIG. 23, in S703, a protective layer may be formed over the substrate, the protective layer exposing the first gate opening, and a first surface treatment process may be performed on the initial work function layer formed in the first gate opening. FIG. 18 illustrates a schematic cross-sectional view of a semiconductor structure according to some embodiments of the present disclosure.

Referring to FIG. 18, a protective layer 305 may be formed over the substrate, and the protective layer may expose the first gate opening 311. For example, the protective layer 305 may be formed in the second region II to cover the second gate opening 312. The protective layer 305 may be used to protect an initial work function layer formed subsequently in the second gate opening 312 from being etched during cycling the combined etching process. In one embodiment, the protective layer 305 may be made of a photoresist.

Further, after the formation of the protective layer 305 in the second region II, a first surface treatment process may be performed on the initial work function layer 304 formed in the first gate opening 311. In one embodiment, the first surface treatment process may be a hydrophilic treatment process.

The hydrophilic treatment process may reduce the surface tension of the initial work function layer 304 in the first gate opening 311, thereby improving the surface hydrophilicity of the initial work function layer 304. Therefore, in a subsequent oxide etching process, the contact area between the surface of the initial work function layer 304 and the etching solution used in the oxide etching process may increase. As such, during the oxide etching process, the etching efficiency may be improved.

In one embodiment, the solution used in the hydrophilic treatment process may be a solution including isopropanol (e.g. an isopropanol solution). The mass concentration of the isopropanol solution may be in a range of approximately 10% to 100%. The mass concentration of the isopropanol solution may not be too low, otherwise the hydrophilic treatment process may not have desired effect on the surface of the initial work function layer 304.

The surface tension of the isopropanol solution may be small, while the surface tension of the etching solution used in the oxide etching process may be large. Therefore, after the isopropanol solution wets the surface of the initial work function layer 304, the surface tension of the initial work function layer 304 and the surface tension of the etching solution used in the oxide etching process can be balanced, such that a desired hydrophilic effect may be achieved.

In other embodiments, the solution used in the hydrophilic treatment process may include an ethanol solution or an acetone solution. The mass concentration of the ethanol solution may be in a range of approximately 10% to 100%, and the mass concentration of the acetone solution may be in a range of approximately 10% to 100%.

The processing time of the first surface treatment process may not be too long or too short. For example, when the processing time of the first surface treatment process is less than 10 s, improvement on the surface hydrophilicity of the initial work function layer 304 formed in the first gate opening 311 may not be sufficient. However, when the processing time of the first surface treatment process is longer than 25 s, the production efficiency may be reduced, and the production capacity may be wasted. Therefore, in one embodiment, the processing time of the first surface treatment process may be in a range of approximately 10 s to 25 s.

Figure 19:
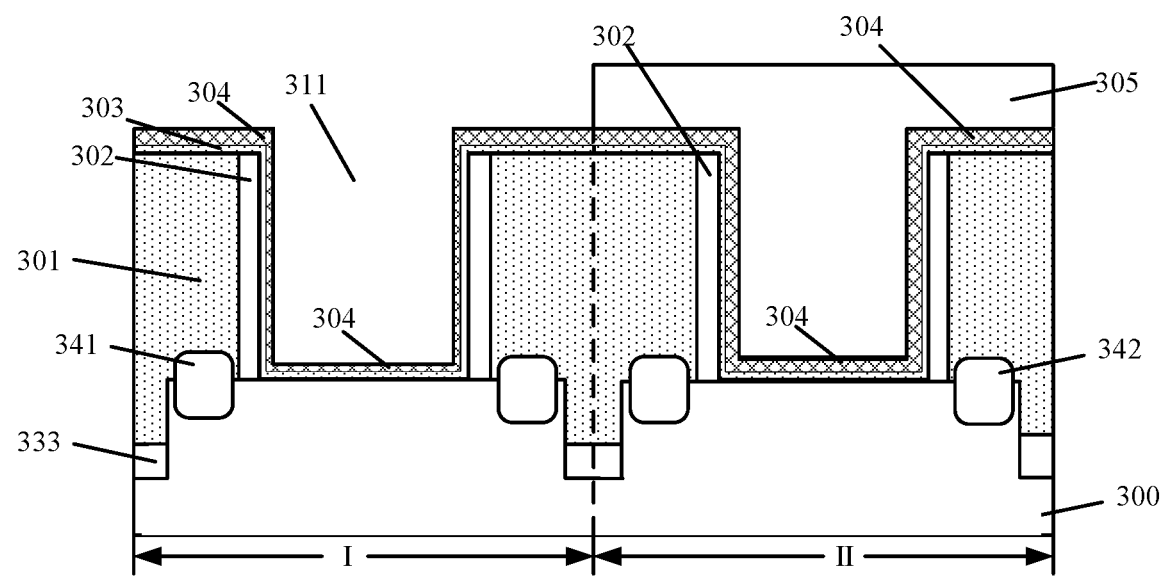

Further, returning to FIG. 23, in S704, after the completion of the first surface treatment process, an oxidized surface portion of the initial work function layer may be removed by performing an oxide etching process on the initial work function layer formed in the first gate opening. FIG. 19 illustrates a schematic cross-sectional view of a semiconductor structure according to some embodiments of the present disclosure.

Referring to FIG. 19, after performing the first surface treatment process, the initial work function layer 304 formed in the first gate opening 311 may be etched by an oxide etching process. The oxide etching process may be performed to remove an oxidized surface portion of the initial work function layer 204. Therefore, after removing the oxide layer on the surface of the initial work function layer 204, and the initial work function layer 204 may then be removed through a subsequently-performed main etching process. As such, the initial work function layer 204 can be removed completely.

In one embodiment, the oxide etching process may include a first wet etching process. The first wet etching process may demonstrate an isotropic etching effect, and may be able to quickly and efficiently remove the oxide layer formed on the surface of the initial work function layer 304 that is disposed on the bottom and sidewall surfaces of the first gate opening 311.

In one embodiment, the etching solution used in the first wet etching process may include a hydrogen fluoride solution. The volume ratio of hydrogen fluoride to water in the hydrogen fluoride solution may be approximately 1:200.

The oxide of the initial work function layer 304 may be an alkaline oxide, and the hydrogen fluoride solution is an acid solution. Therefore, the hydrogen fluoride solution may be able to quickly react with the oxide of the initial work function layer 304, and thus the oxide layer formed on the surface of the initial work function layer 304 can be quickly removed. In the meantime, the etching effect of the hydrogen fluoride solution may also be easily controlled.

In other embodiments, the etching solution used in the first wet etching process may include a mixed solution of ammonia ($NH_4OH$) and hydrogen peroxide ($H_2O_2$) at a temperature in a range of approximately 50° C. to 70° C., a mixed solution of hydrogen chloride (HCl) and $H_2O_2$ at a temperature in a range of approximately 50° C. to 70° C., or a mixed solution of phosphoric acid ($H_3PO_4$) and $H_2O_2$ at a temperature in a range of approximately 50° C. to 70° C.

The reaction time of the first wet etching process may not be too long or too short. For example, when the reaction time of the first wet etching process is less than 10 s, the oxide of the initial work function layer 304 may not be completely removed, which may further affect the effect of the main etching process that is subsequently performed. However, when the reaction time of the first wet etching process is longer than 60 s, the production efficiency may be reduced and the production capacity may not be desired. Therefore, in one embodiment, the reaction time of the first wet etching process may be in a range of approximately 10 s to 60 s.

Figure 20:
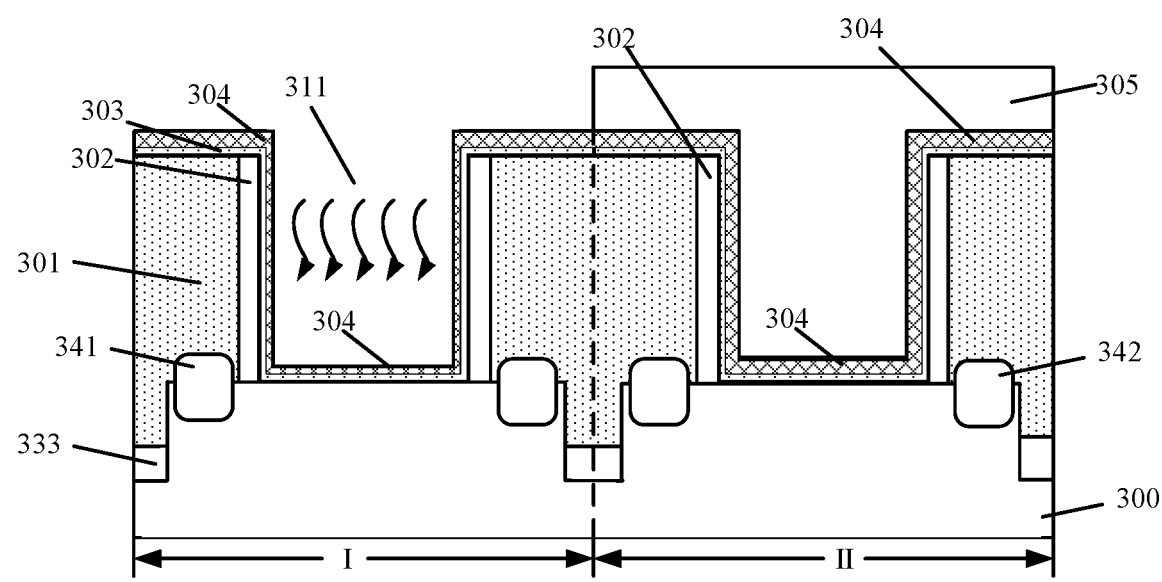

Further, returning to FIG. 23, in S705, after performing the oxide etching process, a second surface treatment process may be performed on the initial work function layer formed in the first gate opening. FIG. 20 illustrates a schematic cross-sectional view of a semiconductor structure according to some embodiments of the present disclosure.

Referring to FIG. 20, after the completion of the oxide etching process, a second surface treatment process may be performed on the initial work function layer 304 that is formed in the first gate opening 311. In one embodiment, the second surface treatment process may be a hydrophilic treatment process.

The hydrophilic treatment process may reduce the surface tension of the initial work function layer 304 in the first gate opening 311, thereby improving the surface hydrophilicity of the initial work function layer 304. Therefore, in a subsequent main etching process, the contact area between the surface of the initial work function layer 304 and the etching solution used in the main etching process may increase. As such, during the main etching process, the etching efficiency may be improved.

In one embodiment, the solution used in the hydrophilic treatment process may be a solution including isopropanol (e.g. an isopropanol solution). The mass concentration of the isopropanol solution may be in a range of approximately 10% to 100%. The mass concentration of the isopropanol solution may not be too low, otherwise the hydrophilic treatment process may not have desired effect on the surface of the initial work function layer 304.

The surface tension of the isopropanol solution may be small, while the surface tension of the etching solution used in the main etching process may be large. Therefore, after the isopropanol solution wets the surface of the initial work function layer 304, the surface tension of the initial work function layer 304 and the surface tension of the etching solution used in the main etching process can be balanced, such that a desired hydrophilic effect may be achieved.

In other embodiments, the solution used in the hydrophilic treatment process may include an ethanol solution or an acetone solution. The mass concentration of the ethanol solution may be in a range of approximately 10% to 100%, and the mass concentration of the acetone solution may be in a range of approximately 10% to 100%.

The processing time of the second surface treatment process may not be too long or too short. For example, when the processing time of the second surface treatment process is less than 10 s, improvement on the surface hydrophilicity of the initial work function layer 304 formed in the first gate opening 311 may not be sufficient. However, when the processing time of the second surface treatment process is longer than 25 s, the production efficiency may be reduced, and the production capacity may be wasted. Therefore, in one embodiment, the processing time of the second surface treatment process may be in a range of approximately 10 s to 25 s.

Further, returning to FIG. 23, in S706, after performing the second surface treatment process on the initial work function layer formed in the first gate opening, the initial work function layer may be etched by a main etching process to remove the exposed initial work function layer. FIG. 21 illustrates a schematic cross-sectional view of a semiconductor structure according to some embodiments of the present disclosure.

Referring to FIG. 21, after performing the second surface treatment process, a main etching process may be performed on the initial work function layer 304 to remove the exposed layer of the initial work function layer 304. In one embodiment, the main etching process may be performed to remove the initial work function layer 304.

In one embodiment, the main etching process may include a second wet etching process. The second wet etching process may demonstrate an isotropic etching effect, and may be able to quickly and efficiently remove the oxide layer formed on the surface of the initial work function layer 304 that is disposed on the bottom and sidewall surfaces of the first gate opening 311.

The etching solution used in the second wet etching process may include a hydrogen peroxide solution, a mixed solution of ammonia water and hydrogen peroxide, or a mixed solution of hydrogen chloride and hydrogen peroxide. In one embodiment, the etching solution used in the second wet etching process may include a hydrogen peroxide solution, and the temperature of the hydrogen peroxide solution may be in a range of approximately 50° C. to 80° C.

The reaction time of the second wet etching process may not be too long or too short. For example, when the reaction time of the second wet etching process is less than 15 s, the initial work function layer 304 may not be completely removed, which may further affect the performance of the formed devices. However, when the reaction time of the second wet etching process is longer than 30 s, the excessively long reaction time may result in over etching, and thus cause damages to the fin structures. In addition, the excessively long reaction time may also reduce the production efficiency and waste the production capacity. Therefore, in one embodiment, the reaction time of the second wet etching process may be in a range of approximately 15 s to 30 s After the initial work function layer 304 is etched by the main etching process, the first gate opening 311 is rinsed with DI water.

In one embodiment, using DI water to rinse the first gate opening 311 may be able to remove a substantial portion of the reaction by-products generated in the first gate opening 311. Thus, the etching efficiency may be improved when subsequently repeating the combined etching process by cycling the oxide etching process and the main etching process.

As such, the initial work function layer 304 is first etched by performing the oxide etching process, and then the remaining portion of the initial work function layer is etched by performing the main etching process. As such, the initial work function layer 304 may be completely removed, and thus the performance of the semiconductor device may be prevented from being degraded due to incomplete removal of the initial work function layer. As such, the performance of the formed semiconductor structure may be improved.

In other embodiments, when the initial work function layer formed in the first gate opening is etched by cycling the combined etching process multiple times, each cycle of the combined etching process may include exemplary fabrication steps described above.

When the initial work function layer includes a plurality of layers, the number of cycling times of the combined etching process may be smaller than or equal to the number of layers that form the initial work function layer.

After the initial work function layer 304 in the first gate opening 311 is etched by cycling the combined etching process one or more times to form a work function layer 306 in the first gate opening 311, the method may further include performing a drying treatment process on the substrate. The drying treatment process may include electric hot-plate heating drying, air heating drying, hydrothermal drying, or chemical reagent dehydration treatment. The reagent used for the chemical reagent dehydration treatment may include an isopropanol solution at a temperature in a range of approximately 50° C. to 75° C.

In one embodiment, the substrate drying treatment may include chemical reagent dehydration treatment. The reagent used for the chemical reagent dehydration treatment may include an isopropanol solution at a temperature in a range of approximately 50° C. to 75° C.

Isopropanol is a colorless and transparent liquid with low surface tension, such that isopropanol can dehydrate the substrate to achieve the drying purpose and facilitate subsequent processes.

After an exposed initial work function layer 304 in the first gate opening 311 is removed, the protective layer 305 may be removed to expose the second gate opening 312. In one embodiment, the process for removing the protective layer 305 may include an ashing process.

Further, returning to FIG. 23, in S707, after a work function layer is formed in the second gate opening, a gate electrode layer may be formed in the first gate opening and the second gate opening. FIG. 22 illustrates a schematic cross-sectional view of a semiconductor structure according to some embodiments of the present disclosure.

Referring to FIG. 22, after forming the work function layer 306 in the second gate opening 312, a gate electrode layer 307 may be formed in the first gate opening 311 and the second gate opening 312. The gate electrode layer 307 and the sidewall spacer 302 may together form a gate structure.

The method for forming the gate electrode layer 307 may include the following exemplary steps. First, a gate material layer (not shown) may be formed in the first gate opening 311 and the second gate opening 312 and over the substrate. Then, the gate material layer may be planarized until the dielectric layer 301 is exposed. As such, the gate electrode layer 307 may be formed in the first gate opening 311 and the second gate opening 312.

The gate electrode layer 307 may be made of a material including polycrystalline silicon, metal, or the like. In one embodiment, the gate electrode layer may be made of a metal. The metal may include tantalum, tungsten, tantalum nitride, or titanium nitride, or a combination thereof.

In one embodiment, the gate material layer may be formed by a deposition process, including at least one of a PVD process, a CVD process, or an ALD process.

As such, in the formed semiconductor structure, the gate structure in the first region I may and the gate structure in the second region II have different work function layers. For example, the thickness of the work function layer formed for the gate structure in the first region I may be different from the thickness of the work function layer formed for the gate structure in the second region II. As such, a semiconductor structure with different functions may be formed over the same substrate.

Correspondingly, the present disclosure also provides a semiconductor structure. The semiconductor structure may be formed by a method consistent with various embodiments of the present disclosure.

Although the present disclosure is disclosed as above, but the present disclosure is not limited to above-described embodiments. Any skilled in the art may make various modifications and changes without departing from the spirit and scope of the present disclosure. Therefore, the scope of the present invention shall be subject to the scope defined by the claims.

What is claimed is:

1. A method for forming a semiconductor structure, comprising:
   providing a substrate structure, including:
      a substrate, including a first region and a second region, and
      a dielectric layer disposed on the substrate, wherein the dielectric layer in the first region includes a first gate opening, and the dielectric layer in the second region includes a second gate opening;
   forming at least one initial work function layer on bottom and sidewall surfaces of the first gate opening and bottom and sidewall surfaces of the second gate opening; and
   performing at least one cycle of a combined etching process to etch the at least one initial work function layer formed in the first gate opening and form a work function layer in the second gate opening from the at least one initial work function layer, wherein each cycle of the combined etching process includes:
      performing an oxide etching process to etch the at least one initial work function layer; and
      after the oxide etching process, performing a main etching process on the at least one initial work function layer to remove an exposed initial work function layer of the at least one initial work function layer.

2. The method according to claim 1, wherein:
   the at least one initial work function layer is made of a material including titanium nitride ($TiN_x$), titanium aluminide (TiAl), tantalum nitride ($TaN_x$), or a combination thereof.

3. The method according to claim 1, wherein:
   the oxide etching process includes a first wet etching process.

4. The method according to claim 3, wherein:
   an etching solution used in the first wet etching process includes a hydrogen fluoride (HF) solution; and a volume ratio of hydrogen fluoride to water in the HF solution is 1:200.

5. The method according to claim 1, wherein:
the main etching process includes a second wet etching process.

6. The method according to claim 5, wherein:
an etching solution used in the second wet etching process includes one of a hydrogen peroxide ($H_2O_2$) solution, a mixed solution of ammonia water ($NH_4OH$) and hydrogen peroxide, and a mixed solution of hydrogen chloride (HCl) and hydrogen peroxide; and
a temperature of the etching solution is in a range of approximately 50° C. to 80° C.

7. The method according to claim 1, wherein after performing the main etching process to etch the at least one initial work function layer, each cycle of the combined etching processes further includes using deionized (DI) water to rinse the first gate opening.

8. The method according to claim 1, wherein when the at least one initial work function layer includes more than one initial work function layer, a number of cycling times of the combined etching process is smaller than or equal to a number of layers that form the at least one initial work function layer.

9. The method according to claim 1, after the work function layer is formed in the second gate opening, further including:
performing a drying treatment process on the substrate, wherein:
the drying treatment process includes electric hot-plate heating drying, air heating drying, hydrothermal drying, or chemical reagent dehydration treatment.

10. The method according to claim 9, wherein:
the drying treatment process includes chemical reagent dehydration treatment; and
a solution used in the chemical reagent dehydration treatment includes an isopropanol solution at a temperature in a range of approximately 50° C. to 75° C.

11. The method according to claim 1, prior to forming the at least one initial work function layer on the bottom and sidewall surfaces of the first gate opening and the bottom and sidewall surfaces of the second gate opening, further including:
forming a stop layer on the bottom and sidewall surfaces of the first gate opening and the bottom and sidewall surfaces of the second gate opening.

12. The method according to claim 11, wherein:
the stop layer is made of a material including tantalum nitride ($TaN_x$), or a high-k dielectric material, wherein:
a dielectric constant of the high-k dielectric material is larger than 3.9; and
the high-k dielectric material includes at least one of hafnium oxide ($HfO_2$), alumina ($Al_2O_3$), and zirconia ($ZrO_2$).

13. The method according to claim 1, wherein:
the substrate includes a base substrate, a first fin structure disposed on the base substrate of the first region, and a second fin structure disposed on the base substrate of the second region;
the dielectric layer is disposed on the first fin structure, the second fin structure, and the substrate;
the first gate opening is formed in the dielectric layer and exposes at least a portion of the first fin structure; and
the second gate opening is formed in the dielectric layer and exposes at least a portion of the second fin structure.

14. The method according to claim 1, after the work function layer is formed in the second gate opening, further including:
forming a gate electrode layer in the first gate opening and the second gate opening.

15. A method for forming a semiconductor structure, comprising:
providing a substrate structure, including:
a substrate, including a first region and a second region, and
a dielectric layer disposed on the substrate, wherein the dielectric layer in the first region includes a first gate opening, and the dielectric layer in the second region includes a second gate opening;
forming at least one initial work function layer on bottom and sidewall surfaces of the first gate opening and bottom and sidewall surfaces of the second gate opening, and
performing at least one cycle of a combined etching process to etch the at least one initial work function layer formed in the first gate opening and form a work function layer in the second gate opening from the at least one initial work function layer, wherein each cycle of the combined etching process includes:
performing an oxide etching process to etch the at least one initial work function layer; and
after the oxide etching process, performing a main etching process on the at least one initial work function layer to remove an exposed initial work function layer of the at least one initial work function layer, wherein each cycle of the combined etching processes further includes:
prior to performing the oxide etching process, performing a first surface treatment process on the at least one initial work function layer formed in the first gate opening.

16. The method according to claim 15, wherein:
the first surface treatment process includes a hydrophilic treatment process; and
a solution used in the hydrophilic treatment process includes an isopropanol solution.

17. The method according to claim 15, wherein:
the at least one initial work function layer is made of a material including titanium nitride ($TiN_x$), titanium aluminide (TiAl), tantalum nitride ($TaN_x$), or a combination thereof.

18. The method according to claim 15, wherein:
the oxide etching process includes a first wet etching process.

19. A method for forming a semiconductor structure, comprising:
providing a substrate structure, including:
a substrate, including a first region and a second region, and
a dielectric layer disposed on the substrate, wherein the dielectric layer in the first region includes a first gate opening, and the dielectric layer in the second region includes
a second gate opening;
forming at least one initial work function layer on bottom and sidewall surfaces of the first gate opening and bottom and sidewall surfaces of the second gate opening; and
performing at least one cycle of a combined etching process to etch the at least one initial work function layer formed in the first gate opening and form a work function layer in the second gate opening from the at least one initial work function layer, wherein each cycle of the combined etching process includes:

performing an oxide etching process to etch the at least one initial work function layer; and after the oxide etching process, performing a main etching process on the at least one initial work function layer to remove an exposed initial work function layer of the at least one initial work function layer, wherein each cycle of the combined etching processes further includes:

prior to performing the main etching process, and after performing the oxide etching process, performing a second surface treatment process on the at least one initial work function layer formed in the first gate opening.

20. The method according to claim 19, wherein:

the second surface treatment process includes a hydrophilic treatment process; and a solution used in the hydrophilic treatment process includes an isopropanol solution.

* * * * *